US012742796B2

(12) United States Patent
Xie et al.

(10) Patent No.: US 12,742,796 B2
(45) Date of Patent: Sep. 22, 2026

(54) TESTING SYSTEM, BATTERY PRODUCTION LINE, AND TESTING METHOD

(71) Applicant: CONTEMPORARY AMPEREX TECHNOLOGY CO., LIMITED, Ningde City (CN)

(72) Inventors: Weihong Xie, Ningde (CN); Shiping Qiu, Ningde (CN); Haijie Wang, Ningde (CN); Guangwei Zhou, Ningde (CN); Xueqing Gong, Ningde (CN); Dingshan Yu, Ningde (CN)

(73) Assignee: CONTEMPORARY AMPEREX TECHNOLOGY CO., LIMITED, Ningde City (CN)

( * ) Notice: Subject to any disclaimer, the term of this patent is extended or adjusted under 35 U.S.C. 154(b) by 153 days.

(21) Appl. No.: 18/785,922

(22) Filed: Jul. 26, 2024

(65) Prior Publication Data

US 2025/0123307 A1 Apr. 17, 2025

Related U.S. Application Data

(63) Continuation of application No. PCT/CN2023/139611, filed on Dec. 18, 2023.

(30) Foreign Application Priority Data

Oct. 11, 2023 (CN) ......................... 202311309926.4

(51) Int. Cl.
*G01R 31/00* (2006.01)
*G01R 1/073* (2006.01)
(Continued)

(52) U.S. Cl.
CPC ..... *G01R 1/07342* (2013.01); *G01R 31/3865* (2019.01); *H01M 10/486* (2013.01); *H01M 10/04* (2013.01)

(58) Field of Classification Search
CPC ............ G01R 31/2808; G01R 31/2834; G01R 31/382; G01R 31/378; G01R 31/3865;
(Continued)

(56) References Cited

U.S. PATENT DOCUMENTS 7,786,742 B2 * 8/2010 Krishnaswami ....... G09G 3/006 324/754.03
11,764,414 B2 * 9/2023 Chae .................... G01R 31/385 324/426

(Continued)

FOREIGN PATENT DOCUMENTS

CN 109342969 A 2/2019
CN 110794318 * 2/2020

(Continued)

OTHER PUBLICATIONS

First Office Action of CN Application No. 202311309926.4, dated Nov. 17, 2023.

(Continued)

*Primary Examiner* — Thang X Le
(74) *Attorney, Agent, or Firm* — Ladas & Parry LLP

(57) ABSTRACT

The present disclosure discloses a testing system, a battery production line, and a testing method. The testing system includes a control device and a test device. The test device includes at least two probe card adjustment assemblies. The control device is connected to the test device and configured to adjust the probe card adjustment assemblies according to an adjustment strategy, and drive the adjusted probe card adjustment assemblies to test the battery module currently to be tested. The adjustment strategy is determined based on current module information corresponding to the battery module and historical module information. The historical module information is the module information of a battery module tested last time. The technical solution provided by the embodiments of the present disclosure can quickly adjust (Continued)

the probe card adjustment assemblies to adapt to different battery modules.

20 Claims, 15 Drawing Sheets

(51) Int. Cl.
*G01R 31/385* (2019.01)
*H01M 10/48* (2006.01)
*H01M 10/04* (2006.01)

(58) Field of Classification Search
CPC .............. G01R 1/0416; G01R 1/07342; G01R 31/367; G01R 31/374; G01R 31/379; G01R 31/387; G01R 31/389; G01R 31/392; G01R 31/3842; G01R 31/3606; G01R 31/3624; G01R 31/3634; G01R 31/3648; G01R 31/3651; G01R 31/3662; G01R 31/3665; G01R 31/3675; G01R 31/3679; H01M 10/04; H01M 10/0482; H01M 10/4285; H01M 10/486
See application file for complete search history.

(56) References Cited

U.S. PATENT DOCUMENTS

2017/0219626 A1* 8/2017 Gardell .............. G01R 1/07364
2023/0216098 A1 7/2023 Sandoval
2024/0426936 A1* 12/2024 Wang .................. G01R 31/396
2025/0110177 A1* 4/2025 Saito .................. G01R 31/3644

FOREIGN PATENT DOCUMENTS

CN 112130051 A 12/2020
CN 212321799 U 1/2021
CN 212622987 U 2/2021
CN 113533980 A 10/2021
CN 113725521 A 11/2021
CN 114200265 A 3/2022
CN 114397576 A 4/2022
CN 115032539 A 9/2022
CN 115201701 A 10/2022
CN 115524624 A 12/2022
CN 219210760 U 12/2022
CN 115598387 A 1/2023
CN 116359757 A 6/2023
CN 116454352 A 7/2023
CN 116559697 A 8/2023
CN 117054696 A 11/2023
DE 102011112532 * 3/2013
DE 102011112532 A1 3/2013
JP 2016018634 A 2/2016
JP 2022048067 A 3/2022
WO 2021109126 A1 6/2021
WO 2021218134 A1 11/2021

OTHER PUBLICATIONS

Notice of Grant of Invention Patent Right for CN application No. 202311309926.4, dated Jan. 9, 2024.
International Search Report for PCT application No. PCT/CN2023/139611, dated Jul. 8, 2024.
Written Opinion of The International Searching Authority for PCT application No. PCT/CN2023/139611, dated Jul. 8, 2024.
Extended European Search Report for EP application No. 23892792.5, dated May 21, 2025.

* cited by examiner

TESTING SYSTEM, BATTERY PRODUCTION LINE, AND TESTING METHOD

CROSS-REFERENCE TO RELATED APPLICATIONS

This application is a continuation of International Patent Application No. PCT/CN2023/139611, filed on Dec. 18, 2023, which claims priority to Chinese Patent Application No. 202311309926.4, filed on Oct. 11, 2023. The aforementioned patent applications are incorporated herein by reference in their entirety.

TECHNICAL FIELD

The present disclosure relates to the technical field of battery production, and in particular, to a testing system, a battery production line, and a testing method.

BACKGROUND

New energy batteries are increasingly used in life and industry. For example, new energy vehicles equipped with batteries have been widely used. In addition, batteries are increasingly used in the field of energy storage and the like.

New energy batteries are increasingly used in life and industry. For example, new energy vehicles equipped with batteries have been widely used. In addition, batteries are increasingly used in the field of energy storage and the like.

In the battery manufacturing process, especially when testing the battery cells in the battery module, since there are many different types of battery modules, and different types of battery modules contain different battery cells, or the battery cells in different types of battery modules are arranged in different ways, the test device needs to be adaptively adjusted when switching between different battery modules.

SUMMARY

In order to solve the above technical problems, it is an object of the present disclosure to provide a testing system, a battery production line and a testing method.

The present disclosure is implemented through the following technical solutions.

A first aspect of the present disclosure provides a testing system, the testing system including a control device and a test device. The test device includes at least two probe card adjustment assemblies; the control device is connected to the test device, and is configured to adjust the probe card adjustment assemblies according to an adjustment strategy, and drive the adjusted probe card adjustment assemblies to test the battery module currently to be tested; the adjustment strategy is determined according to the current module information corresponding to the battery module and historical module information; and the historical module information is the module information of the battery module tested last time.

In the technical solution of the embodiment of the present disclosure, the test device further includes a frame, and the at least two probe card adjustment assemblies are arranged along a first direction. The probe card adjustment assembly includes: a probe card carrying member slidably connected to a frame along the first direction; and at least two probe cards to which at least two probes arranged along a second direction are connected. The probes are configured to test the battery module. The at least two probe cards include a follower probe card and a sliding probe card. The follower probe card is fixedly connected to the probe card carrying member, and the sliding probe card is slidably connected to the probe card carrying member along the first direction. The first direction is arranged at an included angle with respect to the second direction.

In the technical solution of the embodiments of the present disclosure, the frame is configured to carry the probe card adjustment assembly. The probe card adjustment assembly includes a probe card carrying member and at least two probe cards. The probe card carrying member can bring along the at least two probe cards thereon to slide along the first direction, so as to adjust the spacing between the probe cards on two adjacent probe card carrying members, that is, to adjust the distance between two adjacent follower probe cards. On this basis, one of the at least two probe cards on the same probe card carrying member can move relative to the probe card carrying member, so as to adjust the spacing between the at least two probe cards on the same probe card carrying member, that is, to adjust the distance between the follower probe card and the sliding probe card connected to the same probe card carrying member. Due to provision of the probe card carrying member, multiple probe cards can be brought along to move at the same time, thereby improving the adjustment efficiency, and during the switching of battery modules in different battery rows, instead of moving each probe card on the probe card carrying member, it is only necessary to move the probe card carrying member to achieve rapid switching to adapt to battery modules in different battery rows.

In some implementations of the present disclosure, a power assembly is further included. The power assembly includes a crossbeam, a crossbeam driving member and a probe card connecting mechanism. The crossbeam is slidably connected to the frame along the first direction. The crossbeam driving member is connected to the frame, and is connected in transmission to the crossbeam to drive the crossbeam to move relative to the frame along the first direction. The probe card connecting mechanism is connected to the crossbeam, and is detachably connected to any of the probe cards.

Here, the crossbeam of the power assembly is slidable relative to the frame along the first direction. The crossbeam can be driven by the crossbeam driving member to move to the position of any of the probe cards, and the probe card connecting mechanism is connected to the probe card, so that the crossbeam can bring along the probe card to move. As such, various probe cards can be driven to move by one power assembly, thereby simplifying the structure.

In some implementations of the present disclosure, the probe card connecting mechanism includes a probe card connection driving member and a probe card connecting member. The probe card connection driving member is connected to the crossbeam. The probe card connecting member is connected to an output of the probe card connection driving member. The probe card connection driving member is configured to drive the probe card connecting member to move close to or away from any of the probe cards. The probe card connecting member is detachably connected to any of the probe cards.

Here, the probe card connection driving member can drive the probe card connecting member to move close to the probe card to connect the probe card connecting member to the probe card, so that the power assembly can drive the probe card to move relative to the frame. The probe card connection driving member can also drive the probe card connecting member to move away from the probe card to separate the probe card connecting member from the probe card, so that the power assembly can drive the crossbeam to move independently without adjusting the position of the probe card. Driving is provided by the driving member, which provides reliable power and is easy to realize.

In some implementations of the present disclosure, the probe card connecting member is provided with a protrusion at the end away from the probe card connection driving member, and the probe card is provided with a recess; or, the probe card connecting member is provided with a recess at the end away from the probe card connection driving member, and a protrusion is provided on the probe card. The protrusion can extend into the recess, so that the probe card connecting member abuts against the probe card connected thereto along the first direction.

Here, the protrusion extends into the recess, and the outer wall of the protrusion and the inner wall of the recess are fitted together to enable the probe card connecting member to abut against the probe card along the first direction, so that the probe card connecting member brings along the probe card to move, and the probe card connecting member can be separated from the probe card by simply driving the protrusion out of the recess by the probe card connection driving member, which is a simple operation with high efficiency.

In some implementations of the present disclosure, the probe card adjustment assembly further includes a first probe card locking member and a second probe card locking member. The first probe card locking member is connected to the frame and is configured to lock or unlock the probe card carrying member relative to the frame. The second probe card locking member is connected to the probe card carrying member and is configured to lock or unlock the sliding probe card relative to the probe card carrying member.

Here, the first probe card locking member can lock the corresponding probe card carrying member relative to the frame, so as to fix the probe card carrying member and the follower probe card thereon relative to the frame for testing. The first probe card locking member can also unlock the corresponding probe card carrying member, so that the probe card carrying member can move relative to the frame. Accordingly, the second probe card locking member can lock the corresponding follower probe card relative to the probe card carrying member. When the probe card carrying member is locked by the corresponding first probe card locking member, the sliding probe card is fixed relative to the frame for testing. The second probe card locking member can also unlock the corresponding sliding probe card, so that the sliding probe card can move relative to the corresponding probe card carrying member.

In some implementations of the present disclosure, the probe card adjustment assembly further includes a probe card positioning sensor. The probe card positioning sensor is connected to the probe card and is configured to detect the position of the corresponding probe card relative to the frame.

Here, by providing the probe card positioning sensor, the position of each probe card relative to the frame can be obtained, so that the power assembly can quickly and accurately locate the probe card, and the power assembly can move the probe card to the target position.

In some implementations of the present disclosure, the probes are slidably connected to the corresponding probe card along the second direction, and the test device further includes a probe adjustment assembly. The probe adjustment assembly includes a probe adjustment carrying member, a probe adjustment driving member, and a probe connecting mechanism. The probe adjustment carrying member is slidably connected to the crossbeam along the second direction. The probe adjustment driving member is connected to the crossbeam, and is connected in transmission to the probe adjustment carrying member to drive the probe adjustment carrying member to move relative to the crossbeam along the second direction. The probe connecting mechanism is connected to the probe adjustment carrying member, and the probe connecting mechanism is detachably connected to any of the probes.

Here, the probe adjustment carrying member is slidably connected to the crossbeam, and the probe driving member can drive the probe adjustment carrying member to move relative to the crossbeam along the second direction, so that on one hand, the probe adjustment carrying member can move to the position of the probe to be adjusted, and on the other hand, the probe connecting mechanism on the probe adjustment carrying member can move the probe to be adjusted to the target position, thereby facilitating adjustment of the probe spacing on the same probe card to adapt to battery modules of different models.

In some implementations of the present disclosure, the probe connecting mechanism includes a probe connection driving member and a probe connecting member. The probe connection driving member is connected to the probe adjustment carrying member. The probe connecting member is connected to the output of the probe connection driving member. The probe connection driving member is configured to drive the probe connecting member to move close to or away from any of the probes, and the probe connecting member is detachably connected to any of the probe cards.

Here, the probe connection driving member can drive the probe connecting member to move close to the probe to connect the probe connecting member to the probe, so that the probe adjustment driving member can drive the probe to move relative to the frame. The probe connection driving member can also drive the probe connecting member to move away from the probe to separate the probe connecting member from the probe, so that the probe adjustment driving member to drive the probe adjustment carrying member to move independently in order to find the position of the probe to be adjusted. Driving is provided by the driving member, which provides reliable power and is easy to realize.

In some implementations of the present disclosure, the probe adjustment assembly further includes a first probe locking member and a second probe locking member. The first probe locking member is connected to the probe adjustment carrying member. A second probe locking member is connected to each probe. The second probe locking member can abut against the first probe locking member along the second direction to lock the probe connected with the second probe locking member relative to the probe adjustment carrying member. The second probe locking member is slidably connected to the corresponding probe to abut against the first probe locking member.

Here, the second probe locking member can abut against the first probe locking member, so that the first probe locking member limits the movement of the second probe locking member in the second direction, thereby limiting the movement of the probe connected to the probe locking member relative to the probe card along the second direction. The second probe locking member can also be separated from the first probe locking member. At this time, the probe on the second probe locking member can move along the second direction to adjust the spacing between the multiple probes on the probe card.

In some implementations of the present disclosure, the probe adjustment assembly further includes an unlocking driving member connected to the probe adjustment carrying member. The unlocking driving member can drive any of the second probe locking members to separate the corresponding second probe locking member from the first probe locking member.

Here, the unlocking driving member is connected to the probe adjustment carrying member, and can follow the probe adjustment carrying member in movement relative to the crossbeam to move to the position of the probe to be adjusted, and is mated with the second probe locking member on the probe to be adjusted to drive the second probe locking member to be separated from the corresponding first probe locking member, so as to unlock the probe to be adjusted relative to the probe card. As such, multiple probes to be adjusted can be unlocked with only one unlocking driving member, which has a simple structure and is easy to operate.

In some implementations of the present disclosure, the probe adjustment assembly further includes a probe positioning sensor connected to the probe adjustment carrying member. A marker section is provided on the probe, and the probe positioning sensor is configured to detect the marker section.

Here, the probe positioning sensor is provided, the probe positioning sensor follows the movement of the probe adjustment carrying member, and the probe positioning sensor can identify the marker section, so as to determine whether there is a probe at the target position on the probe card and to assist in positioning of the probe connecting member relative to the probe to facilitate adjustment of the position of the probe.

In some implementations of the present disclosure, the probe adjustment assembly further includes a probe positioning driving member slidingly connected to the crossbeam along the second direction. The probe adjustment carrying member is connected to the output of the probe positioning driving member. The probe positioning driving member is configured to drive the probe adjustment carrying member to move close to or away from the probe.

Here, the probe positioning driving member can drive the probe adjustment carrying member to move close to or away from the probe, and consequently cause the probe positioning sensor to move close to or away from the probe. When the probe positioning sensor moves close to the probe, interference can be reduced and the detection accuracy of the sensor can be improved. When the probe positioning driving member drives the probe adjustment carrying member to move away from the probe, more space can be left for the position of the probe to facilitate testing of the battery module.

In some implementations of the present disclosure, a module bracket is further included. The module bracket is configured for placing the battery module. The module bracket can move relative to the frame along a third direction to move the battery module close to or away from the probe. The third direction is arranged at an included angle with respect to the first direction and the second direction respectively.

Here, the module bracket is provided to provide support for the battery module and to provide position limit for the battery module. The module bracket can move relative to the frame along the third direction, and consequently bring along the battery module to move close to or away from the probe, so that the battery module can be kept away from the probe during replacement of the battery module to protect the probe, which can facilitate testing and also improve the adjustment capability, facilitating testing of battery modules of different sizes.

In some implementations of the present disclosure, a lifting driving member is further included. The lifting driving member is connected to the frame. The output shaft of the lifting driving member is connected to the module bracket to drive the module bracket to move along the third direction.

Here, the module bracket is driven in movement by the lifting driving member, which has a reliable structure and is easy to realize.

In some implementations of the present disclosure, a classification sensor is further included. The classification sensor is configured to detect the type of the battery module.

Here, the type of battery module can be detected by the classification sensor, so that the probe card and probe can be adapted according to the type of the battery module, which is more intelligent.

In some implementations of the present disclosure, a temperature measurement assembly is further included, and a temperature measurement sensor is also included. The temperature measurement sensor is connected to the frame and is configured to detect the temperature of the battery module.

Here, by providing the temperature measurement sensor, the temperature of the battery module during testing can be monitored to provide an early warning when the temperature of the battery module is abnormal.

In some implementations of the present disclosure, a temperature measurement assembly is further included. The temperature measurement assembly includes a first temperature measurement carrying member and a first temperature measurement driving member. The temperature measurement sensor is connected to the first temperature measurement carrying member. The first temperature measurement driving member is connected to the frame and is configured to drive the first temperature measurement carrying member to move along the first direction.

Here, the first temperature measurement driving member can drive the first temperature measurement carrying member to move relative to the frame, and consequently drive the temperature measurement sensor to move, so that the temperature measurement sensor can move close to or away from the battery module on the frame along the first direction to adapt to battery modules of different sizes.

In some implementations of the present disclosure, the temperature measurement assembly further includes a second temperature measurement carrying member and a second temperature measurement driving member. The first temperature measurement driving member is connected to the second temperature measurement carrying member. The first temperature measurement carrying member is slidably connected to the second temperature measurement carrying member along the first direction. The second temperature measurement driving member is connected to the frame and configured to drive the second temperature measurement carrying member to move along the second direction.

Here, the second temperature measurement driving member can drive the second temperature measurement carrying member to move relative to the frame along the second direction, and consequently drive the temperature measurement sensor to move close to or away from the battery module on the frame along the second direction to adapt to the difference in size of different battery models in the second direction.

In some implementations of the present disclosure, the temperature measurement assembly further includes a third temperature measurement carrying member and a third temperature measurement driving member. The second temperature measurement driving member is connected to the third temperature measurement carrying member. The second temperature measurement carrying member is slidably connected to the third temperature measurement carrying member along the second direction. The third temperature measurement driving member is connected to the frame and configured to drive the third temperature measurement carrying member to move along the third direction. The third direction is arranged at an included angle with respect to the first direction and the second direction respectively.

Here, the third temperature measurement driving member can drive the third temperature measurement carrying member to move relative to the frame along the third direction, and consequently drive the temperature measurement sensor to move close to or away from the battery module on the frame along the third direction to adapt to the difference in size of different battery models in the third direction.

A second aspect of the present disclosure provides a battery production line, including a production device, a transfer device and the testing system of any item of the first aspect. The production device is configured to produce a battery module to be tested, and the transfer device is configured to take out the battery module to be tested from the production device and place it in the testing system, or take out the battery module that has been tested from the testing system and transfer it to the target station.

As the battery production line provided by the embodiment of the present disclosure includes the test device of the first aspect, it has the same technical effects, that is, it has high adjustment efficiency and can quickly switch the spacing between the probe cards to adapt to different types of battery modules.

A third aspect of the present disclosure provides a testing method. The method includes: obtaining current module information corresponding to a battery module currently to be tested; determining an adjustment strategy for a probe card adjustment assembly based on the current module information and historical module information, the historical module information being module information of the battery module tested last time; and adjusting the probe card adjustment assembly according to the adjustment strategy, and driving the adjusted probe card adjustment assembly to test the battery module currently to be tested.

The testing method provided by the embodiment of the present disclosure can determine the current adjustment strategy for the probe card adjustment assembly in the test device based on the module information of the battery module tested currently and the module information of the battery tested last time, so that the probe card adjustment assembly can quickly adapt to different types of battery modules.

BRIEF DESCRIPTION OF DRAWINGS

By reading the detailed description of the preferred implementations below, various other advantages and benefits will become apparent to those of ordinary skill in the art. The drawings are for the purpose of illustrating the preferred implementations only and are not to be considered a limitation to the present disclosure. Moreover, in all of the drawings, the same components are indicated by the same reference numerals. In the drawings.

DESCRIPTION OF REFERENCE NUMERALS

Figure 1:
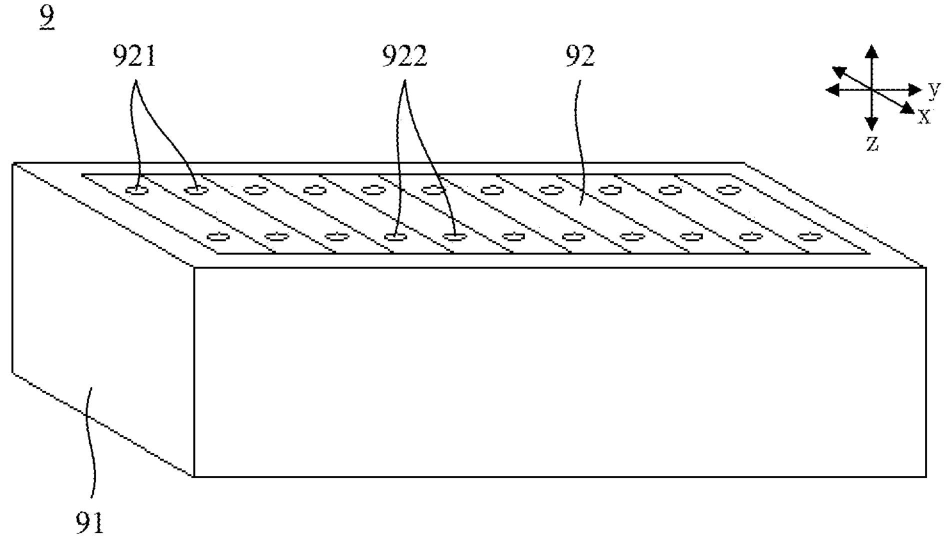
FIG. 1 is a schematic structural diagram of a single-row battery module according to an embodiment of the present disclosure.

1—testing system;
11—control device;
12—test device;
0—frame;
2—probe card adjustment assembly;

21—probe card carrying member;
21*a*—first probe card carrying member;
21*b*—second probe card carrying member;
22—probe card;
22*a*—first probe card;
22*b*—second probe card;
22*c*—third probe card;
22*d*—fourth probe card;
221—recess;
23—probe;
231—probe body;
232—probe connecting portion;
24—first probe card locking member;
25—second probe card locking member;
26—probe card positioning sensor;
3—power assembly;
3*a*—first power assembly;
3*b*—second power assembly;
31—crossbeam;
32—crossbeam driving member;
33—probe card connecting mechanism;
331—probe card connection driving member;
332—probe card connecting member;
4—probe adjustment assembly;
41—probe adjustment carrying member;
42—probe adjustment driving member;
43—probe connecting mechanism;
431—probe connection driving member;
432—probe connecting member;
44—first probe locking member;
45—second probe locking member;
46—unlocking driving member;
47—probe positioning sensor;
48—probe positioning driving member;
5—module bracket;
6—lifting driving member;
7—classification sensor;
8—temperature measurement assembly;
81—temperature measurement sensor;
82—first temperature measurement carrying member;
83—first temperature measurement driving member;
84—second temperature measurement carrying member;
85—second temperature measurement driving member;
86—third temperature measurement carrying member;
87—third temperature measurement driving member;
9—battery module;
91—shell;
92—battery cell;
921—positive electrode terminal post;
922—negative electrode terminal post;
x—first direction;
y—second direction;
z—third direction.

DETAILED DESCRIPTION

Examples of the technical solutions of the present disclosure will be described in detail below in conjunction with the drawings. The following embodiments are only used to illustrate the technical solutions of the present disclosure more clearly, and are therefore used only as examples, and should not be used to limit the protection scope of the present disclosure.

Unless otherwise defined, all technical and scientific terms used herein have the same meaning as commonly understood by those skilled in the art to which the present disclosure belongs; the terms used herein are for the purpose of describing specific embodiments only, and are not intended to limit the present disclosure; the terms "including" and "having" and any variations thereof in the description as well as in the above description of drawings of the present disclosure are intended to cover a non-exclusive inclusion.

At present, new energy batteries are increasingly used in daily life and industry. New energy batteries are not only applied in energy storage power source systems such as water, fire, wind, and solar power stations, but also widely applied in electric transportation tools, such as electric bicycles, electric motorcycles, and electric vehicles, as well as many fields, such as aerospace. With the continuous expansion of the application field of the power batteries, the market demand is also constantly expanding.

In the embodiments of the present disclosure, the battery may be a battery cell. A battery cell refers to a basic unit that can realize the mutual conversion of chemical energy and electrical energy. It can be used to make battery modules or battery packs to provide power to electrical apparatuses. The battery cell may be a secondary battery, which refers to a battery cell that can be used continually by activating an active material by means of charging after the battery cell is discharged. The battery cell may be a lithium ion battery, a sodium ion battery, a sodium lithium ion battery, a lithium metal battery, a sodium metal battery, a lithium sulfur battery, a magnesium ion battery, a nickel hydrogen battery, a nickel cadmium battery, a lead storage battery and the like, which is not limited in the embodiments of the present disclosure.

In the description of the embodiments of the present disclosure, the technical terms "first", "second", "third", and the like are used only to distinguish between different objects, and are not to be understood as indicating or implying a relative importance or implicitly specifying the number, particular order, or primary and secondary relation of the technical features indicated. In the description of the embodiments of the present disclosure, the meaning of "plurality of" is two or more, unless otherwise expressly and specifically defined.

Reference herein to "an example" means that a particular feature, structure, or characteristic described in connection with the example can be included in at least one example of the present disclosure. The appearance of this phrase in various places in the specification does not necessarily refer to the same embodiment, nor is it a separate or alternative embodiment that is mutually exclusive with other embodiments. It is explicitly and implicitly understood by those skilled in the art that the embodiments described herein may be combined with other embodiments.

In the description of the embodiments of the present disclosure, the term "and/or" is only an association relationship for describing associated objects, indicating that three relationships may exist. For example, A and/or B may represent three situations: A exists alone, both A and B exist, and B exists alone. In addition, the character "/" herein generally means that the associated objects before and after it are in an "or" relationship.

In the description of the embodiments of the present disclosure, the technical terms "length", "width", "thickness", "upper", "lower", "front", "rear", "left", "right", "vertical", "horizontal", "top", "bottom", "inner", "outer", and the like indicate orientations or positional relationships based on the orientations or positional relationships shown in the drawings, and are intended only to facilitate and simplify the description of the embodiments of the present disclosure, and are not intended to indicate or imply that the device or element referred to must have a particular orientation, or be constructed, operated, or used in a particular orientation, and therefore should not be construed as limitation of the embodiments of the present disclosure.

In the description of the embodiments of the present disclosure, unless otherwise expressly specified and defined, the technical terms "mounted", "linked", "connected", "fixed", and the like are to be understood broadly, and may, for example, be fixedly connected or detachably connected, or integrated; and may also be mechanically connected or electrically connected; and may be directly linked or indirectly linked through an intermediate medium, and may be internal communication or interaction between two elements. For those of ordinary skill in the art, the specific meanings of the above terms in the embodiments of the present disclosure can be understood according to specific situations.

In the description of the embodiments of the present disclosure, unless otherwise expressly specified and defined, the technical term "contact" shall be understood in a broad sense, either as direct contact, as contact across an intermediate medium layer, as contact between the two in contact that is substantially free of interaction force, or as contact with interaction force between the two in contact.

In the following, the present disclosure will be described in detail.

At present, new energy batteries are increasingly used in daily life and industry. New energy batteries are not only applied in energy storage power source systems such as water, fire, wind, and solar power stations, but also widely applied in electric transportation tools, such as electric bicycles, electric motorcycles, and electric vehicles, as well as many fields, such as aerospace. With the continuous expansion of the application field of the power batteries, the market demand is also constantly expanding.

In the battery manufacturing process, especially when testing the battery cells in the battery module, since there are many different types of battery modules, and different types of battery modules contain different battery cells, or the battery cells in different types of battery modules are arranged in different ways, the test device needs to be adaptively adjusted when switching between different battery modules.

Figure 2:
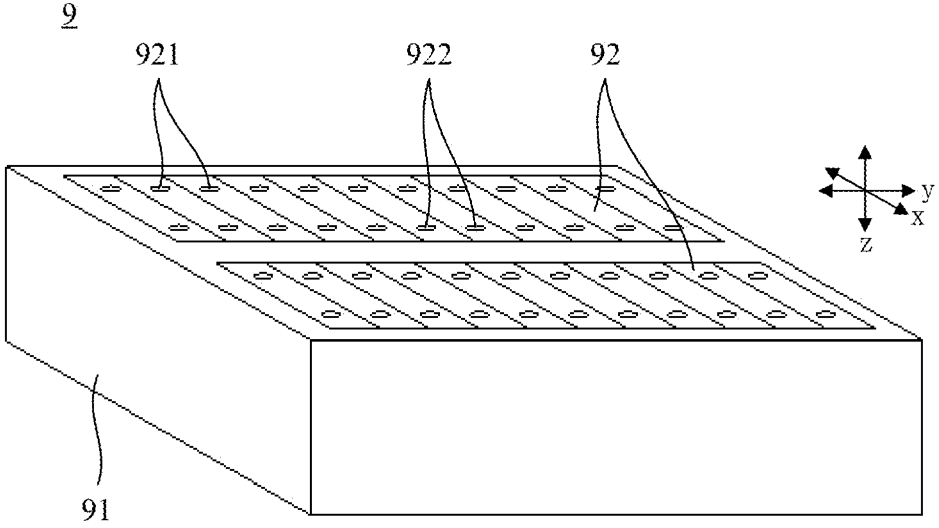
FIG. 2 is a schematic structural diagram of a double-row battery module according to an embodiment of the present disclosure.

Referring to FIGS. 1 and 2, a battery module 9 includes a shell 91 and multiple battery cells 92 arranged in the shell 91. The shell 91 has a rectangular parallelepiped structure. For convenience of explanation, the width direction of the shell 91 is defined as the first direction x, the length direction of the shell 91 as the second direction y, and the thickness direction of the shell 91 as the third direction z, and the multiple battery cells 92 are arranged in a rectangular array.

With continued reference to FIGS. 1 and 2, the battery cell 92 includes two terminal posts, which correspond to the positive electrode terminal post 921 and the negative electrode terminal post 922 of the battery cell 92 respectively, and the terminal posts of the battery cell 92 extend along the third direction z. The third direction z is also the length direction of the battery cell 92. The two terminal posts in the battery cell 92 are arranged along the first direction x. The first direction x is also the width direction of the battery cell 92. The multiple battery cells 92 are arranged along the second direction y to form a battery row, and the second direction y is also the thickness direction of the battery cell 92.

It can be understood that, depending on the different structures of the battery cells 92 in the battery module 9 and the different arrangements of the multiple battery cells 92, the battery module 9 may be of many different types, and different types of battery modules 9 have different structures. For example, when the battery cells 92 are the same, the number of battery cells 92 in different battery modules 9 may be different; for another example, the arrangement of the battery cells 92 in different battery modules 9 may be different. Referring to FIG. 1, the single-row battery module 9 includes only one battery row, and referring to FIG. 2, the double-row battery module 9 includes two parallel battery rows. For yet another example, the structure or size of the battery cells 92 in different battery modules 9 are different. When the spacing between the positive electrode terminal post 921 and the negative electrode terminal post 922 of the battery cells 92 in the two battery modules 9 is the same, they are referred to as modules of the same model. When the spacing between the positive electrode terminal post 921 and the negative electrode terminal post 922 of the battery cells 92 in the two battery modules 9 is different, they are referred to as modules of different models. The test device needs adjustment to adapt to the switching between modules of different models, as well as switching between the single-row battery module 9 and the double-row battery module 9 in modules of the same model.

Figure 3:
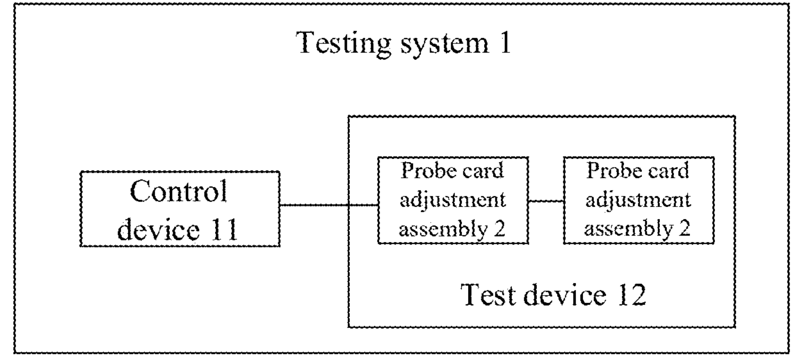
FIG. 3 is a schematic block diagram of a testing system according to an embodiment of the present disclosure.

In view of the problems existing in the above related art, the present disclosure proposes a testing system. Referring to FIG. 3, the testing system 1 includes a control device 11 and a test device 12. The test device 12 includes at least two probe card adjustment assemblies 2. The control device 11 is connected to the test device 12. The control device 11 is configured to adjust the probe card adjustment assemblies 2 according to the adjustment strategy and control the adjusted probe card adjustment assemblies 2 to test the battery module currently to be tested. The adjustment strategy is determined based on the current module information corresponding to the battery module and the historical module information. The historical module information is the module information of the battery module tested last time.

Figure 4:
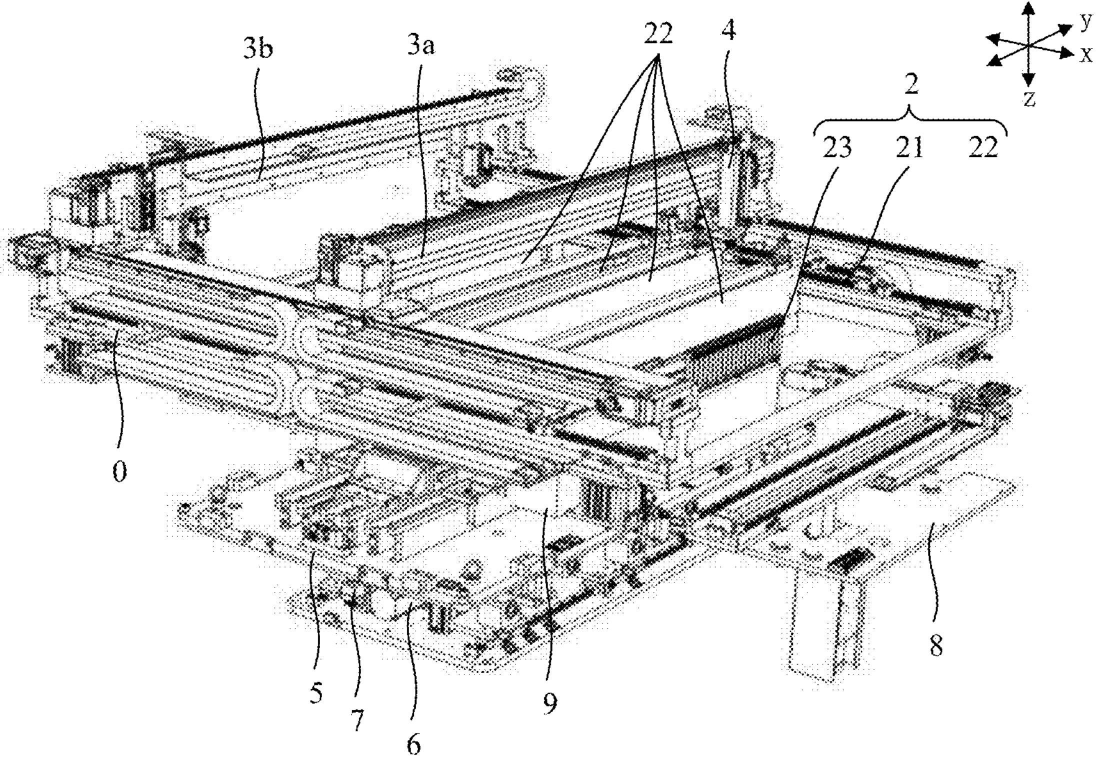
FIG. 4 is a schematic structural diagram of a test device according to an embodiment of the present disclosure.
Figure 5:
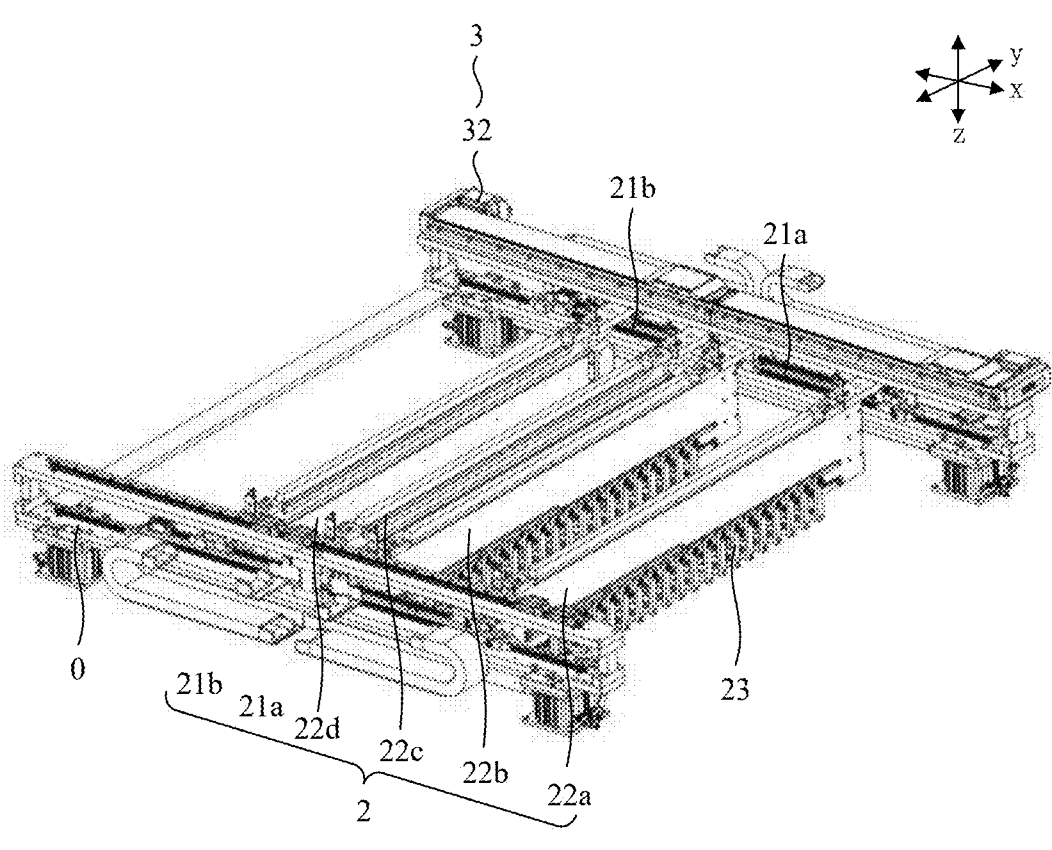
FIG. 5 is a first schematic structural diagram of a probe card adjustment assembly in a test device according to an embodiment of the present disclosure.
Figure 6:
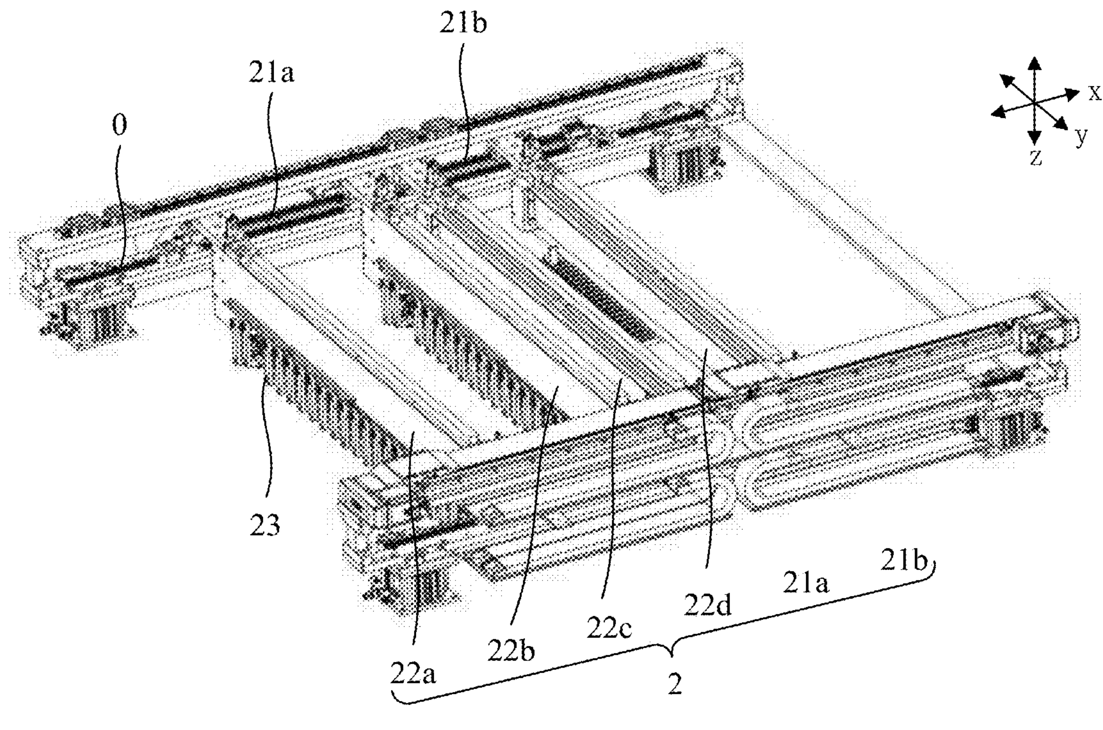
FIG. 6 is a second schematic structural diagram of a probe card adjustment assembly in a test device according to an embodiment of the present disclosure.

In the embodiment of the present disclosure, with reference to FIGS. 4, 5 and 6, the test device includes a frame 0, in which at least two probe card adjustment assemblies 2 are arranged along the first direction x, the probe card adjustment assemblies 2 include a probe card carrying member 21 and at least two probe cards 22, and a probe card carrying member 21 is slidably connected to the frame 0 along the first direction x. At least two probes 23 arranged along the second direction y are connected to the probe card 22. The probes 23 are configured to test the battery module 9. The at least two probe cards 22 include a follower probe card (refer to the second probe card 22*b* or the third probe card 22*c* in FIG. 5) and a sliding probe card (refer to the first probe card 22*a* or the fourth probe card 22*d* in FIG. 5). The follower probe card is fixedly connected to the probe card carrying member 21, and the sliding probe card is slidably connected to the probe card carrying member 21 along the first direction x. The first direction x and the second direction y are different and arranged with an included angle.

In an embodiment of the present disclosure, the frame 0 provides an foundation for installation of the probe card adjustment assemblies 2 and the like. The frame 0 is a truss structure composed of multiple support rods which is light in weight and has strong load-bearing capacity. The probe card adjustment assemblies 2 may be provided at positions such as the middle and upper parts of the frame 0. The drawings of the present disclosure only show part of the support rod structure of the frame 0. In order to further improve the functionality of the frame 0, a protective net is further provided on the flank of the frame 0, and the probe card adjustment assemblies 2 and the like are arranged in the protective net.

In an embodiment of the present disclosure, the first direction x is the width direction of the battery module 9, that is, the direction in which the terminal posts of the battery cells 92 in the battery module 9 are arranged. It may also be the direction in which the battery rows in the battery module 9 are arranged.

In an embodiment of the present disclosure, the probes 23 correspond to the terminal posts of the battery cells 92, and the adjacent probes 23 on the same probe card 22 respectively correspond to the terminal posts of the same polarity of adjacent battery cells 92 in the battery module 9. That is, the probes 23 on the same probe card 22 are configured to test the positive electrode terminal posts 921 of the battery cells 92 in the same battery row, or the probes 23 on the same probe card 22 are configured to test the negative electrode terminal posts 922 of the battery cells 92 in the same battery row.

Accordingly, the probes 23 on two adjacent probe cards 22 may respectively correspond to the positive electrode terminal post 921 or the negative electrode terminal post 922 of the battery cell 92 in the battery row, or may correspond to the terminal posts of the same polarity or the terminal posts of opposite polarities in two different battery rows. In an embodiment of the present disclosure, terminal posts of the same polarity refer to terminal posts that are both positive electrode terminal posts 921, or terminal posts that are both negative electrode terminal posts 922; terminal posts of the opposite polarities refer to terminal posts including both a positive electrode terminal posts 921 and a negative electrode terminal post 922.

In an embodiment of the present disclosure, the probe card adjustment assembly 2 includes a probe card carrying member 21 and at least two probe cards 22. The probe card carrying member 21 can bring along the at least two probe cards 22 thereon to slide along the first direction x, so as to adjust the spacing between the probe cards 22 on the two adjacent probe card carrying members 21, that is, to adjust the distance between the two adjacent follower probe cards.

On this basis, one of the at least two probe cards 22 on the same probe card carrying member 21 can move relative to the probe card carrying member 21, so as to adjust the spacing between the at least two probe cards 22 on the same probe card carrying member 21, that is, to adjust the distance between the follower probe card and the sliding probe card connected to the same probe card carrying member 21.

Due to the provision of the probe card carrying member 21, multiple probe cards 22 can be brought along to move at the same time, thereby improving the adjustment efficiency, and during the switching between the battery modules 9 in different battery rows, instead of moving each probe card 22 on the probe card carrying member 21, only the probe card carrying member 21 needs to be moved to realize rapid switching to adapt to the battery modules 9 in different battery rows.

Figure 7:
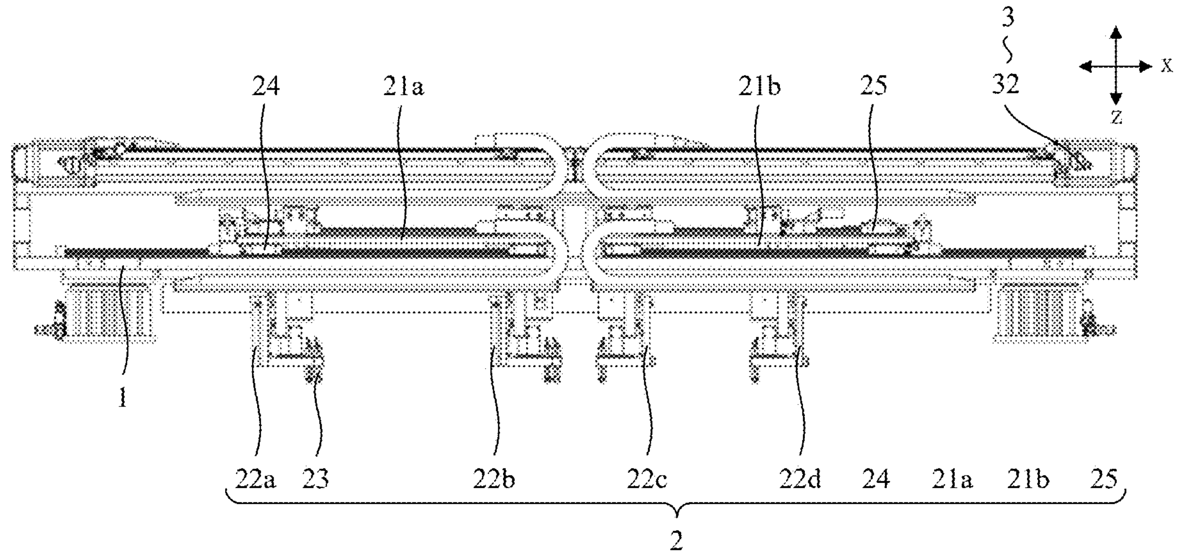
FIG. 7 is a third schematic structural diagram of a probe card adjustment assembly in a test device according to an embodiment of the present disclosure.

The embodiment of the present disclosure does not limit the number of probe card adjustment assemblies 2 and probe cards 22. Referring to FIGS. 5, 6 and 7, in a possible embodiment of the present disclosure, there are two probe card adjustment assemblies 2 of the same structure. Each probe card adjustment assembly 2 includes a probe card carrying member, a first probe card carrying member 21*a* and a second probe card carrying member 21*b* respectively. The first probe card carrying member 21*a* and the second probe card carrying member 21*b* slide relative to the frame 0 independently.

Figure 8:
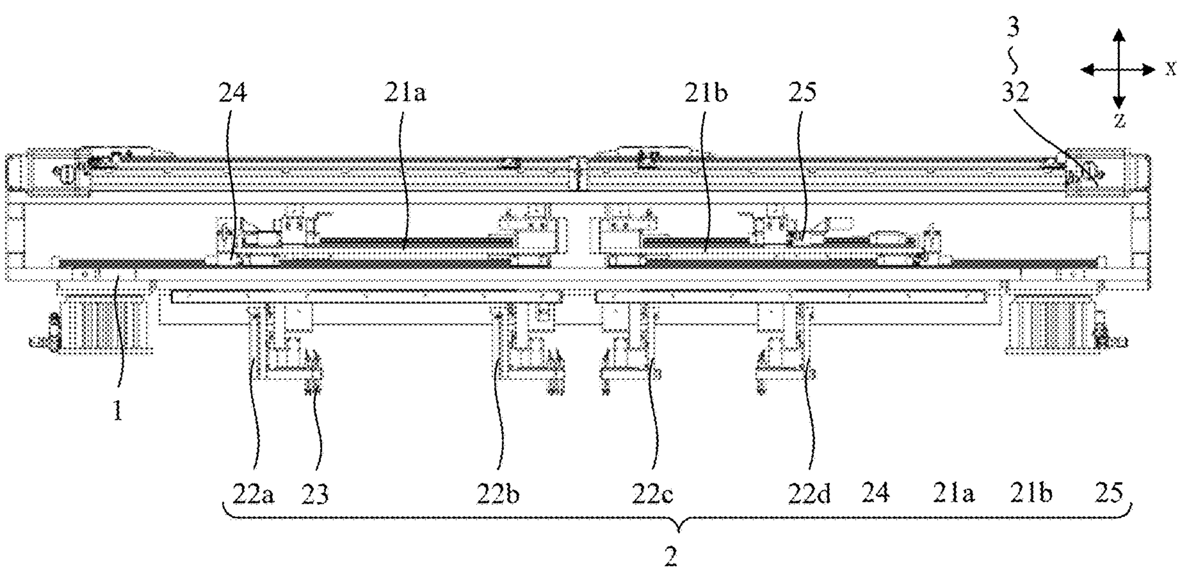
FIG. 8 is a fourth schematic structural diagram of a probe card adjustment assembly in a test device according to an embodiment of the present disclosure.

Each probe card adjustment assembly 2 includes two probe cards 22. Referring to FIGS. 7 and 8, one probe card adjustment assembly 2 includes a first probe card 22*a* and a second probe card 22*b*. The first probe card 22*a* is slidably connected to the first probe card carrying member 21*a*, and the second probe card 22*b* is fixedly connected to the first probe card carrying member 21*a*. The other probe card adjustment assembly 2 includes a third probe card 22*c* and a fourth probe card 22*d*. The third probe card 22*c* is fixedly connected to the second probe card carrying member 21*b*, and the fourth probe card 22*d* is slidably connected to the second probe card carrying member 21*b*.

The first probe card 22*a* and the fourth probe card 22*d* are sliding probe cards, the second probe card 22*b* and the third probe card 22*c* are follower probe cards, and the first probe card 22*a*, the second probe card 22*b*, the third probe card 22*c*, and the fourth probe card 22*d* are arranged in sequence along the first direction x.

In some embodiments, the double-row battery module 9 includes a first battery row and a second battery row. When the test device 12 tests the double-row battery module 9, the probe 23 on the first probe card 22*a* is configured to be connected to the positive electrode terminal post 921 of the battery cell 92 in the first battery row, the probe 23 on the second probe card 22*b* is configured to be connected to the negative electrode terminal post 922 of the battery cell 92 in the first battery row, the probe 23 on the third probe card 22*c* is configured to be connected to the negative electrode terminal post 922 of the battery cell 92 in the second battery row, and the probe 23 on the fourth probe card 22*d* is configured to be connected to the positive electrode terminal post 921 of the battery cell 92 in the second battery row.

When the test device 12 tests the single-row battery module 9, only the probe 23 on the first probe card 22*a* and the probe 23 on the second probe card 22*b* are used, or only the probe 23 on the third probe card 22*c* and the probe 23 on the fourth probe card 22*d* are used. As the battery module 9 is typically positioned at the middle of the frame 0, the probe 23 on the first probe card 22*a* and the probe 23 on the fourth probe card 22*d* can be left blank, and the probe 23 on the second probe card 22*b* is used to be connected to the negative electrode terminal post 922 of the battery cell 92, and the probe 23 on the third probe card 22*c* is used to be connected to the positive electrode terminal post 921 of the battery cell 92.

In an embodiment of the present disclosure, sliding connection means that two members are connected through a slide rail or a slide block, so that the two connected members can reciprocate along a certain direction. In some embodiments, a guide groove may be provided on the slide rail, and the slide block slides in the guide groove, or the slide block is sleeved on the slide rail, so that the slide block slides along the slide rail.

Taking the slide block sleeved on the slide rail as an example, the slide rail may be a cylindrical slide rail, a dovetail slide rail, a T-shaped slide rail, a rectangular slide rail, or the like. The inner contour of the slide block matches the outer contour of the slide rail.

Figure 9:
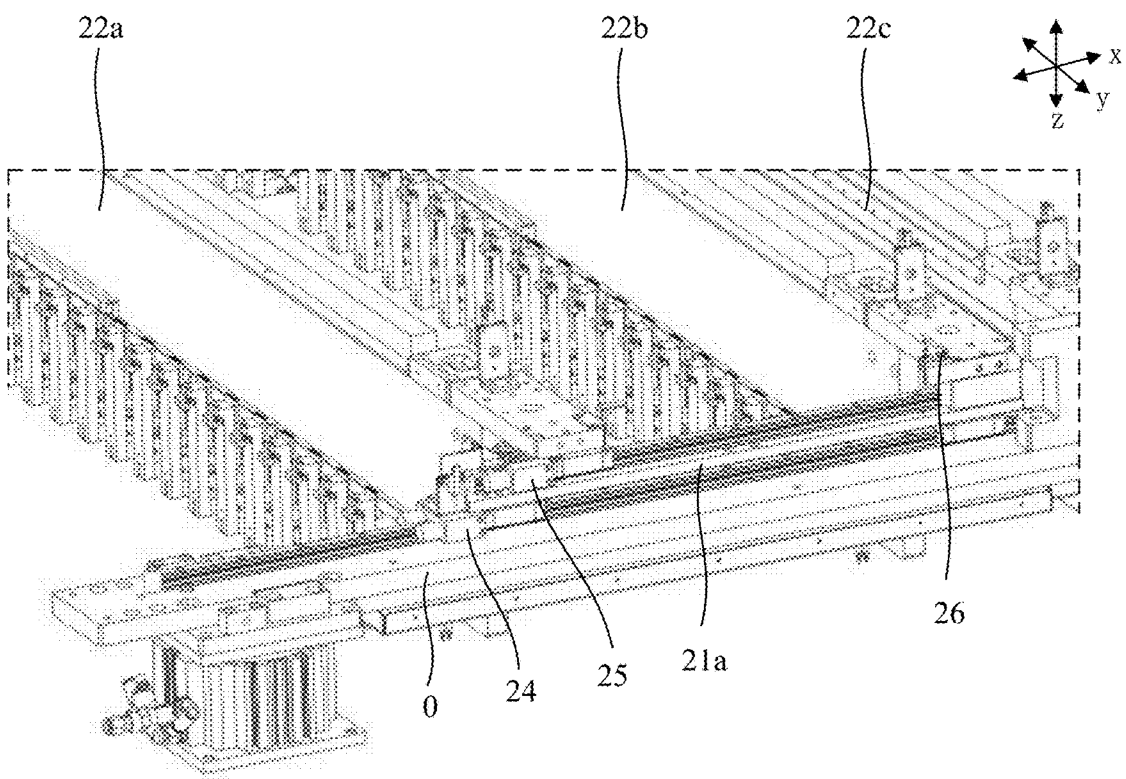
FIG. 9 is a schematic structural diagram of a first probe card locking member and a second probe card locking member in a test device according to an embodiment of the present disclosure.
Figure 10:
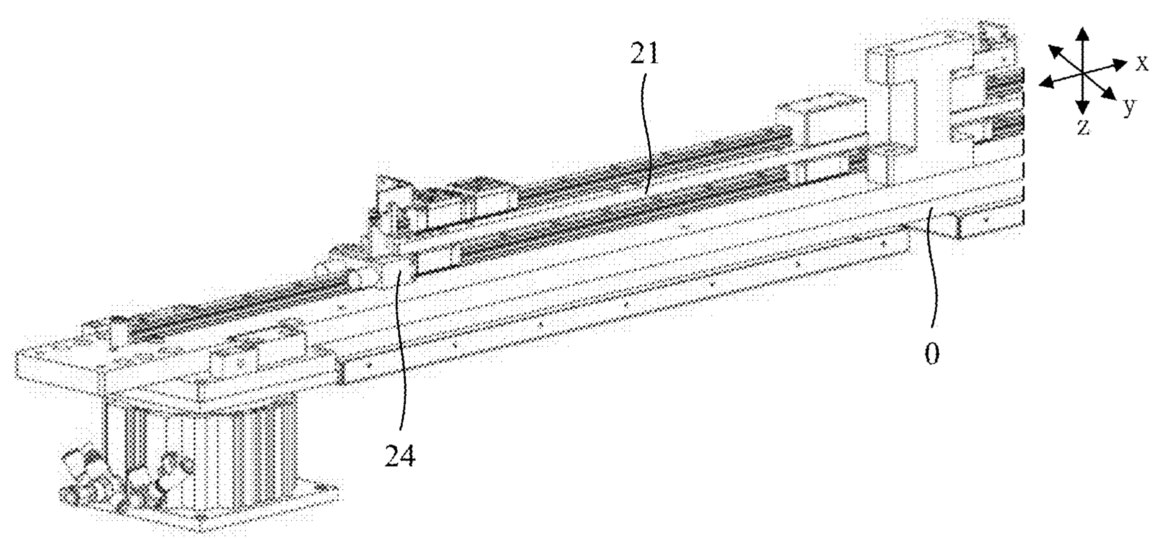
FIG. 10 is a schematic structural diagram of a probe card carrying member in a test device according to an embodiment of the present disclosure.

Referring to FIGS. 9 and 10, in a possible embodiment of the present disclosure, a slide rail is fixedly connected to the frame 0, and the slide rail extends along the first direction x. Two probe card carrying members 21 slide on the slide rail.

The probe card carrying members 21 are sleeved on the outer side of the slide rail to slide along the extension direction of the slide rail.

The two probe card carrying members 21 have the same structure. Taking one of the probe card carrying members 21 as an example, a slide rail is fixedly connected to the probe card carrying member 21 and extends along the first direction x. One end of the slide rail is provided with a follower probe card that is fixedly connected to the probe card carrying member 21. A sliding probe card is slidably connected to the slide rail. The sliding probe card is sleeved on the outer side of the slide rail to slide along the slide rail, so as to change the spacing between the follower probe card and the sliding probe card on the same probe card carrying member 21.

In an embodiment of the present disclosure, in order to improve the stability of the probe card 22, the frame 0 is provided with a slide rail on both sides along the second direction y, and a probe card carrying member 21 is respectively fixedly connected to the two ends of the follower probe card along the second direction y. The probe card carrying member 21 is slidably connected to the slide rail on the corresponding side. Accordingly, the two ends of the sliding probe card along the second direction y are also slidably connected to the corresponding two probe card carrying members 21 respectively, so that both ends of each probe card 22 are supported to improve the stability of the probe card 22.

Figure 11:
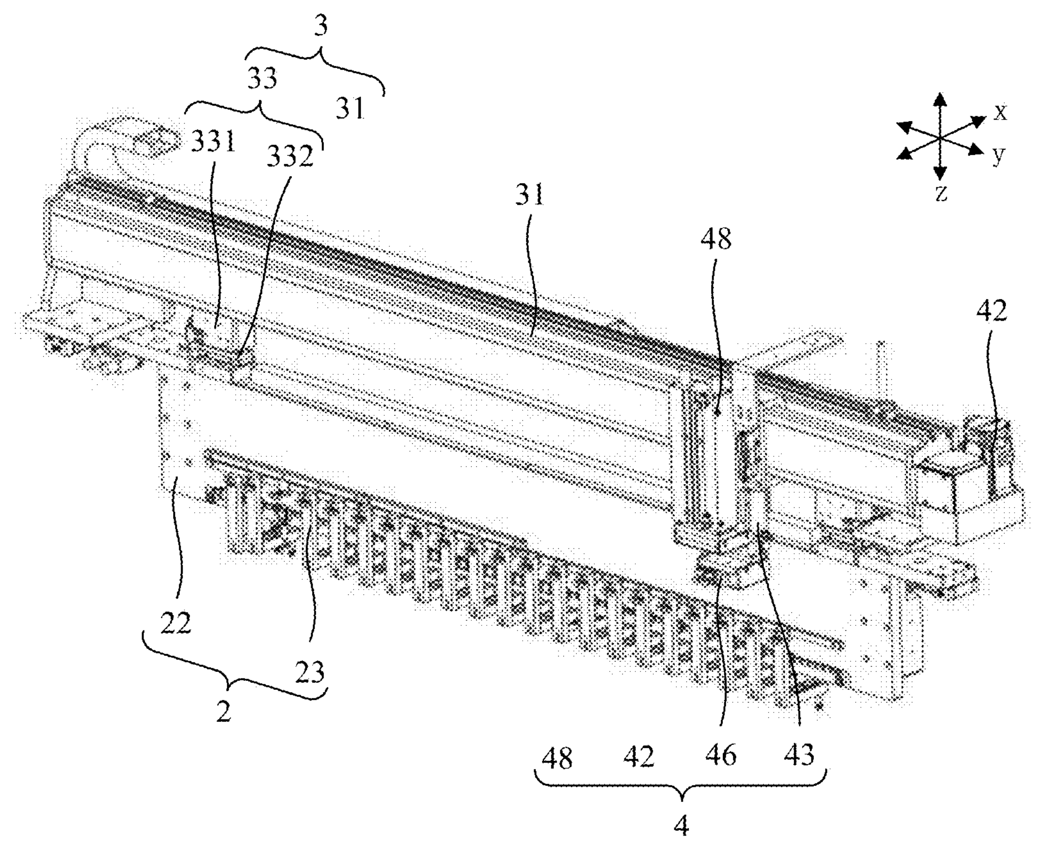
FIG. 11 is a schematic diagram of the connection between a power assembly and a probe card in a test device according to an embodiment of the present disclosure.

Referring to FIGS. 4, 5, and 11, in some implementations of the present disclosure, a power assembly 3 is further included. The power assembly 3 includes a crossbeam 31, a crossbeam driving member 32 and a probe card connecting mechanism 33. The crossbeam 31 is slidably connected to the frame 0 along the first direction x. The beam driving member 32 is connected to the frame 0. The beam driving member 32 is connected in transmission to the crossbeam 31 to drive the crossbeam 31 to move relative to the frame 0 along the first direction x. The probe card connecting mechanism 33 is connected to the crossbeam 31, and the probe card connecting mechanism 33 is detachably connected to any of the probe cards 22.

In an embodiment of the present disclosure, the power assembly 3 is configured to drive the probe card 22 to move to change the spacing between the probe cards 22. In some embodiments, each probe card 22 is provided with a corresponding power assembly 3, or, one power assembly 3 is provided on the frame 0 for adjusting different probe cards 22 to simplify the mechanism.

In an embodiment of the present disclosure, when the probe card connecting mechanism 33 is connected to the follower probe card, the power assembly 3 can drive the follower probe card and the probe card carrying member 21 connected therewith to move together. When the probe card connecting mechanism 33 is connected to the sliding probe card, the power assembly 3 can drive the sliding probe card to move relative to the corresponding probe card carrying member 21.

In an embodiment of the present disclosure, the frame 0 is also provided with a slide rail for carrying the crossbeam 31. The slide rail extends along the first direction x. The crossbeam 31 is connected to the slide rail through a support, so that the crossbeam 31 can move along the first direction x. The crossbeam 31 is configured to carry the probe card connecting mechanism 33, so as to drive the probe card connecting mechanism 33 to move to positions of different probe cards 22.

In an embodiment of the present disclosure, the crossbeam 31 may have a plate-shaped structure, a rod-shaped structure, or the like. For example, the crossbeam 31 has a plate-shaped structure, and third slide rails are slidably connected to two ends of the crossbeam 31 along the second direction y respectively to improve the stability of the crossbeam 31.

In an embodiment of the present disclosure, the crossbeam driving member 32 can generate power to drive the crossbeam 31 to move relative to the frame 0, and consequently drive the probe card connecting mechanism 33 on the crossbeam 31 to move relative to the frame 0. The crossbeam driving member 32 may be a telescopic cylinder, such as a cylinder, a hydraulic cylinder, and the like, and the crossbeam driving member 32 may also be a motor, such as a servo motor, a stepper motor, and the like.

By way of example, the crossbeam driving member 32 is a motor. The crossbeam driving member 32 is fixedly connected to the frame 0. The output shaft of the crossbeam driving member 32 is connected in transmission to the crossbeam 31. In some embodiments, the transmission between the output shaft of the crossbeam driving member 32 and the crossbeam 31 is conducted through rack and gear, screw and nut, worm and gear, and the like, which is not limited in the embodiments of the present disclosure.

In an embodiment of the present disclosure, the test device 12 may be provided with only one power assembly 3 or provided with multiple power assemblies 3 to improve the moving efficiency of the probe cards 22. Referring to FIGS. 4 and 5, in a possible embodiment of the present disclosure, there are two power assemblies 3, a first power assembly 3*a* and a second power assembly 3*b* respectively. The first power assembly 3*a* is used to move the first probe card 22*a* and the second probe card 22*b*, and the second power assembly 3*b* is used to move the third probe card 22*c* and the fourth probe card 22*d*.

Here, the crossbeam 31 of the power assembly 3 can slide relative to the frame 0 along the first direction x. The crossbeam 31 can be driven by the crossbeam driving member 32 to move to the position of any of the probe cards 22. The probe card connecting mechanism 33 is connected with the probe card 22, so that the crossbeam 31 can bring along the probe card 22 to move, and different probe cards 22 can be driven to move by one power assembly 3, thereby simplifying the structure.

In an embodiment of the present disclosure, the probe card connecting mechanism 33 can be connected to or separated from the probe card 22. When the probe card connecting mechanism 33 is connected to the probe card 22, it can bring along the probe card 22 to move. The connection between the two may be clamping, abutting, fastener connection, and the like.

Figure 12:
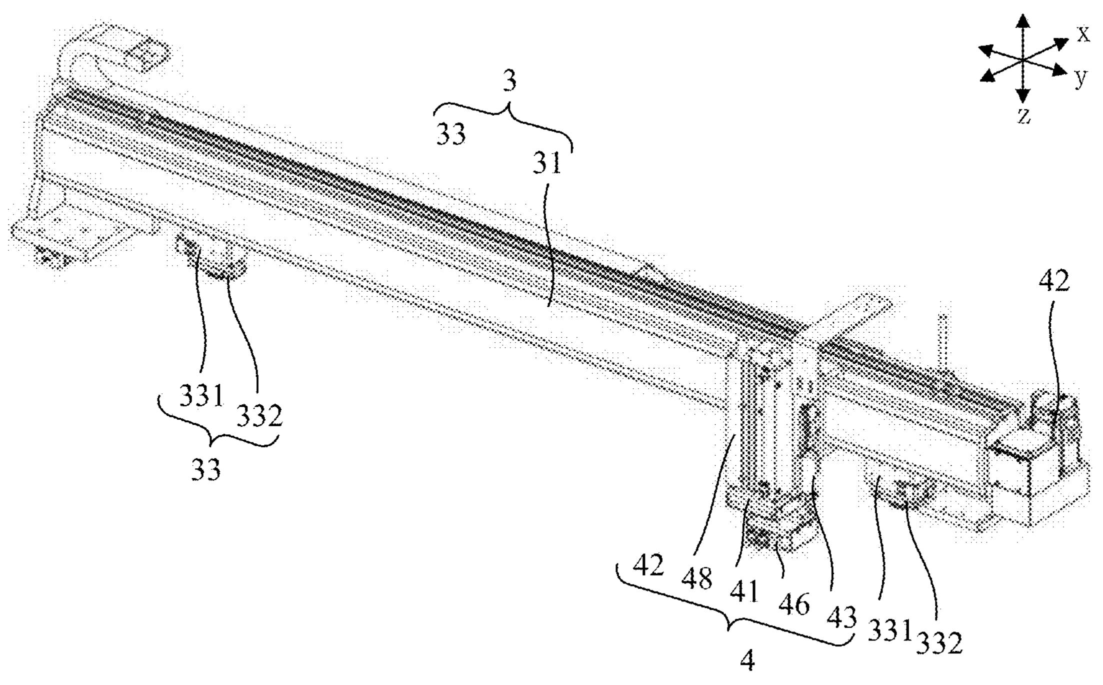
FIG. 12 is a schematic structural diagram of a power assembly in a test device according to an embodiment of the present disclosure.
Figure 13:
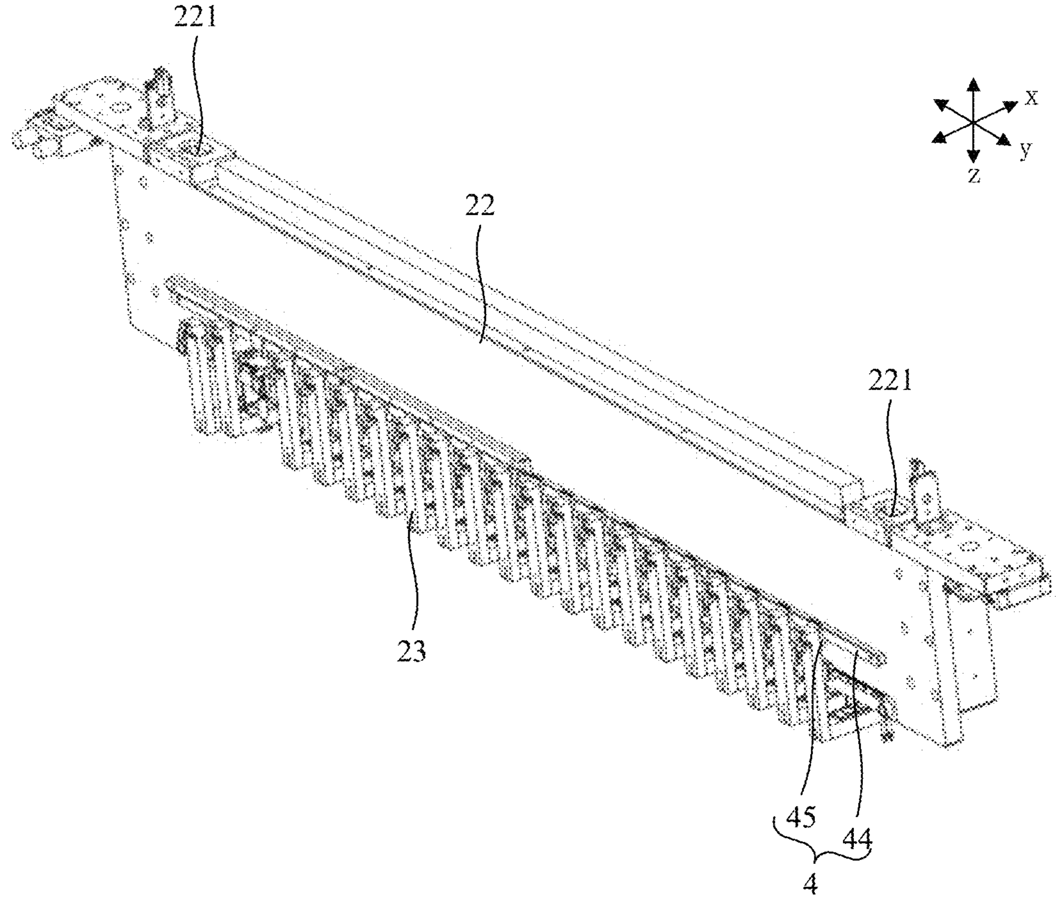
FIG. 13 is a schematic structural diagram of a probe card in a test device according to an embodiment of the present disclosure.

Referring to FIGS. 11, 12, and 13, in some implementations of the present disclosure, the probe card connecting mechanism 33 includes a probe card connection driving member 331 and a probe card connecting member 332. The probe card connection driving member 331 is connected to the crossbeam 31. The probe card connecting member 332 is connected to the output of the probe card connection driving member 331. The probe card connection driving member 331 is configured to drive the probe card connecting member 332 to move close to or away from any of the probe cards 22, and the probe card connecting member 332 is detachably connected to any of the probe cards 22.

In an embodiment of the present disclosure, the probe card connecting member 332 is configured to be connected to or separated from the probe card 22. The probe card connecting member 332 and the probe card 22 can be connected by clamping, abutting, or the like, so that the power assembly 3 can drive the probe card 22 connected thereto to move relative to the frame 0. For example, the probe card connecting member 332 and the probe card 22 are clamped to each other.

In an embodiment of the present disclosure, the probe card connection driving member 331 is configured to drive the probe card connecting member 332. The probe card connection driving member 331 can drive the probe card connecting member 332 to move close to a certain probe card 22 so as to be connected with the probe card 22, or drive the probe card connecting member 332 to move away from the probe card 22 connected therewith so as to be separated from the probe card 22.

In an embodiment of the present disclosure, the probe card connection driving member 331 can drive the probe card connecting member 332 to move along the first direction x, the second direction y or the third direction z. For example, the probe card connection driving member 331 can drive the two probe card connecting members 332 to move close to the probe card 22 along the first direction x respectively, so as to clamp the probe card 22. Referring to FIG. 11, in a possible embodiment of the present disclosure, the probe card connection driving member 331 drives the probe card connecting member 332 to move along the third direction z, and move close to the probe card 22 from the upper side of the probe card 22.

In an embodiment of the present disclosure, the probe card connection driving member 331 may be a telescopic cylinder, such as a pneumatic cylinder, a hydraulic cylinder, or the like, and the probe card connection driving member 331 may also be a motor, such as a servo motor, a stepper motor, or the like. By way of example, the probe card connection driving member 331 is a cylinder. The probe card connection driving member 331 is fixedly connected to the crossbeam 31, and the output shaft of the probe card connection driving member 331 is fixedly connected to the probe card connecting member 332.

Here, the probe card connection driving member 331 can drive the probe card connecting member 332 to move close to the probe card 22, so that the probe card connecting member 332 is connected with the probe card 22, so that the power assembly 3 can drive the probe card 22 to move relative to the frame 0. The probe card connection driving member 331 can also drive the probe card connecting member 332 to move away from the probe card 22, so as to separate the probe card connecting member 332 from the probe card 22, so that the power assembly 3 can drive the crossbeam 31 to move independently without adjusting the position of the probe card 22. Driving is provided by a driving member, which provides reliable power and is easy to realize.

In an embodiment of the present disclosure, one or more probe card connecting mechanisms 33 can be provided on the same crossbeam 31. Referring to FIGS. 11 and 12, in a possible embodiment of the present disclosure, two probe card connecting mechanisms 33 are provided on one crossbeam 31. The two probe card connecting mechanisms 33 are respectively located at two ends of the crossbeam 31, and the two probe card connecting mechanisms 33 can act at the same time to be connected with the two ends of the probe card 22 respectively, thereby allowing evener force application on the probe card 22.

Taking one of the probe card connecting members 332 and the probe card 22 as an example, referring to FIGS. 12 and 13, in some implementations of the present disclosure, the probe card connecting member 332 is provided with a protrusion at the end away from the probe card connection driving member 331. The probe card 22 is provided with recess 221 at a position corresponding to the protrusion. The protrusion can extend into the recess 221 to enable the probe card connecting member 332 to abut against the probe card 22 connected thereto along the first direction x.

In an embodiment of the present disclosure, the protrusion extends along the third direction z, and the radial contour of the protrusion may be rectangular, circular, triangular, or the like. The recess 221 also extends along the third direction z. The radial contour of the recess 221 may be the same as or different from that of the protrusion. The protrusion can extend into the recess 221 to abut against the inner wall of the recess 221 along the first direction x.

In some embodiments, the probe card connecting member 332 is provided with a recess at the end away from the probe card connection driving member 331, and the probe card 22 is provided with a protrusion at a position corresponding to the recess. The protrusion can extend into the recess to enable the probe card connecting member 332 to abut against the probe card 22 connected therewith along the first direction x.

In an embodiment of the present disclosure, a chamfer can be provided at the end of the protrusion close to the probe card 22 to guide the protrusion into the corresponding recess 221. Of course, a chamfer can further be provided at the edge of the recess 221, or at both the protrusion and the recess 221. This is not limited in embodiments of the present disclosure.

Here, the protrusion extends into the recess 221, and the outer wall of the protrusion is fitted to the inner wall of the recess 221, so that the probe card connecting member 332 can abut against the probe card 22 connected therewith along the first direction x, so that the probe card connecting member 332 can bring along the probe card 22 to move, and the probe card connecting member 332 can be separated from the probe card 22 only by driving the protrusion out of the recess 221 by the probe card connection driving member 331, which is a simple operation with high efficiency.

In order to fix the probe card 22 relative to the frame 0 after adjustment, with reference to FIGS. 7 and 8, in some implementations of the present disclosure, the probe card adjustment assembly 2 further includes a first probe card locking member 24 and a second probe card locking member 25. The first probe card locking member 24 is connected to the frame 0 and is configured to lock or unlock the probe card carrying member 21 relative to the frame 0. The second probe card locking member 25 is connected to the probe card carrying member 21 and is configured to lock or unlock the sliding probe card relative to the probe card carrying member 21.

In an embodiment of the present disclosure, the first probe card locking member 24 can be locked or unlocked by magnetic attraction, clamping, or other manners. By way of example, the first probe card locking member 24 is a clamp, and the first probe card locking member 24 is fixedly connected to the probe card carrying member 21. When the first probe card locking member 24 is in a locked state, it can be clamped to the slide rail on which it slides, so as to lock the probe card carrying member 21 connected therewith relative to the frame 0, thus preventing the movement of the probe card carrying member 21 relative to the frame 0. When the first probe card locking member 24 is in the unlocked state, it releases the corresponding slide rail, so that the first probe card locking member 24 and the probe card carrying member 21 can move relative to the frame 0 together.

In an embodiment of the present disclosure, the second probe card locking member 25 and the first probe card locking member 24 may act in the same way or different ways. By way of example, the second probe card locking member 25 is a clamp, and the second probe card locking member 25 is fixedly connected to the corresponding sliding probe card. When the second probe card locking member 25 is in the locked state, it can be clamped to the slide rail on which it slides to lock the sliding probe card connected therewith to the corresponding probe card carrying member 21, thus preventing the movement of the sliding probe card relative to the probe card carrying member 21. When the second probe card locking member 25 is in the unlocked state, it releases the corresponding slide rail, so that the second probe card locking member 25 and the sliding probe card can move relative to the probe card carrying member 21 together.

It can be understood that the normal state of both the first probe card locking member 24 and the second probe card locking member 25 is the locked state. Only when the probe card 22 needs to be moved is the corresponding first probe card locking member 24 or the second probe card locking member 25 switched to the unlocked state.

Here, the first probe card locking member 24 can lock the corresponding probe card carrying member 21 relative to the frame 0, so that the probe card carrying member 21 and the follower probe card thereon are fixed relative to the frame 0 for testing. The first probe card locking member 24 can also unlock the corresponding probe card carrying member 21, so that the probe card carrying member 21 can move relative to the frame 0. Accordingly, the second probe card locking member 25 can lock the corresponding sliding probe card relative to the probe card carrying member 21, and when the probe card carrying member 21 is locked by the corresponding first probe card locking member 24, the sliding probe card can be fixed relative to the frame 0 for testing. The second probe card locking member 25 can also unlock the corresponding sliding probe card, so that the sliding probe card can move relative to the corresponding probe card carrying member 21.

Referring to FIGS. 4 and 9, in some implementations of the present disclosure, the probe card adjustment assembly 2 further includes a probe card positioning sensor 26, which is connected to the probe card 22 and configured to detect the position of the corresponding probe card 22 relative to the frame 0.

In an embodiment of the present disclosure, the probe card positioning sensor 26 may be a capacitive sensor, an inductive sensor, an electromagnetic sensor, a photoelectric sensor, an ultrasonic sensor, or the like. By way of example, the probe card positioning sensor 26 is a photoelectric sensor.

In an embodiment of the present disclosure, a probe card positioning sensor 26 can be installed on each probe card 22. When the crossbeam driving member 32 drives the crossbeam 31 and the probe card connecting member 332 thereon to move to a certain probe card 22, the probe card positioning sensor 26 on the probe card 22 can detect the probe card connecting member 332, so as to determine the position of the probe card 22 relative to the probe card connecting member 332, and then based on the position of the probe card connecting member 332 relative to the frame 0, to determine the position of the probe card 22 relative to the frame 0.

In an embodiment of the present disclosure, a probe card positioning sensor 26 can also be provided on the crossbeam 31, and a mark such as a QR code is provided on each probe card 22. When the probe card positioning sensor 26 follows the crossbeam 31 in movement, it can obtain the position of the corresponding probe card 22 by identifying the mark.

Here, by providing the probe card positioning sensor 26, the position of each probe card 22 relative to the frame 0 can be obtained, so that the power assembly 3 can quickly and accurately locate the probe card 22 and the power assembly 3 can move the probe card 22 to the target position.

In an embodiment of the present disclosure, the control device 11 is connected to the crossbeam driving member 32, the probe card connection driving member 331, the probe card positioning sensor 26, the first probe card locking member 24, the second probe card locking member 25, and the like. The control device 11 controls the actions of the probe card connection driving member 331 and the crossbeam driving member 32 based on the signal from the probe card positioning sensor 26.

By way of example, when the test device 12 makes adjustments to adapt to the single-row battery module 9 or the double-row battery module 9 of the same model, or when the test device 12 makes adjustments to adapt to the double-row battery module 9 with different battery row spacing, with reference to FIGS. 4, 7 and 8, the control device 11 controls the second probe card locking members 25 corresponding respectively to the first probe card 22*a* and the fourth probe card 22*d* to be locked, and controls the first probe card locking members 24 corresponding respectively to the second probe card 22*b* and the third probe card 22*c* to be unlocked.

Then, the control device 11, based on the data acquired by the probe card positioning sensor 26 on the second probe card 22*b*, controls the probe card connecting member 332 of the first power assembly 3*a* to move to the position of the second probe card 22*b* and controls the probe card connection driving member 331 of the first power assembly 3*a* to drive the probe card connecting member 332 of the first power assembly 3*a* to be connected correspondingly with the second probe card 22*b*. Accordingly, the control device 11, based on the data acquired by the probe card positioning sensor 26 on the third probe card 22*c*, controls the probe card connecting member 332 of the second power assembly 3*b* to move to the position of the third probe card 22*c*, and controls the probe card connection driving member 331 of the second power assembly 3*b* to drive the probe card connecting member 332 of the second power assembly 3*b* to be connected correspondingly to the third probe card 22*c*.

Then, the control device 11 controls the crossbeam driving member 32 of the first power assembly 3*a* to drive the second probe card 22*b* and the first probe card carrying member 21*a* connected therewith and the first probe card 22*a* to move to the target position through the probe card connecting member 332 on the crossbeam 31. Accordingly, the control device 11 also controls the crossbeam driving member 32 of the second power assembly 3*b* to drive the third probe card 22*c* and the second probe card carrying member 21*b* connected therewith and the fourth probe card 22*d* to move to the target position through the probe card connecting member 332 on the crossbeam 31.

Thereafter, the control device 11 controls the first probe card locking member 24 corresponding to the second probe card 22*b* to lock the first probe card carrying member 21*a*, and controls the first probe card locking member 24 corresponding to the third probe card 22*c* to lock the second probe card carrying member 21*b*.

By way of example, when the test device 12 make adjustments to adapt to battery modules 9 of different models, with reference to FIGS. 4, 7 and 8, the control device 11 controls the second probe card locking members 25 corresponding respectively to the first probe card 22*a* and the fourth probe card 22*d* to be unlocked, and controls the first probe card locking members 24 corresponding respectively to the second probe card 22*b* and the third probe card 22*c* to be locked.

Then, the control device 11, based on the data acquired by the probe card positioning sensor 26 on the first probe card 22*a*, controls the probe card connecting member 332 of the first power assembly 3*a* to move to the position of the first probe card 22*a* and controls the probe card connection driving member 331 of the first power assembly 3*a* to drive the probe card connecting member 332 of the first power assembly 3*a* to be correspondingly connected with the first probe card 22*a*. Accordingly, the control device 11, based on the data acquired by the probe card positioning sensor 26 on the fourth probe card 22*d*, controls the probe card connecting member 332 of the second power assembly 3*b* to move to the position of the fourth probe card 22*d* and controls the probe card connection driving member 331 of the second power assembly 3*b* to drive the probe card connecting member 332 of the second power assembly 3*b* to be connected correspondingly with the fourth probe card 22*d*.

Then, the control device 11 controls the crossbeam driving member 32 of the first power assembly 3*a* to drive the first probe card 22*a* to move to the target position through the probe card connecting member 332 on the crossbeam 31. Accordingly, the control device 11 also controls the crossbeam driving member 32 of the second power assembly 3*b* to drive the fourth probe card 22*d* to move to the target position through the probe card connecting member 332 on the cross beam 31.

Thereafter, the control device 11 controls the second probe card locking member 25 corresponding to the first probe card 22*a* to lock the first probe card 22*a*, and controls the second probe card locking member 25 corresponding to the fourth probe card 22*d* to lock the fourth probe card 22*d*.

Figure 14:
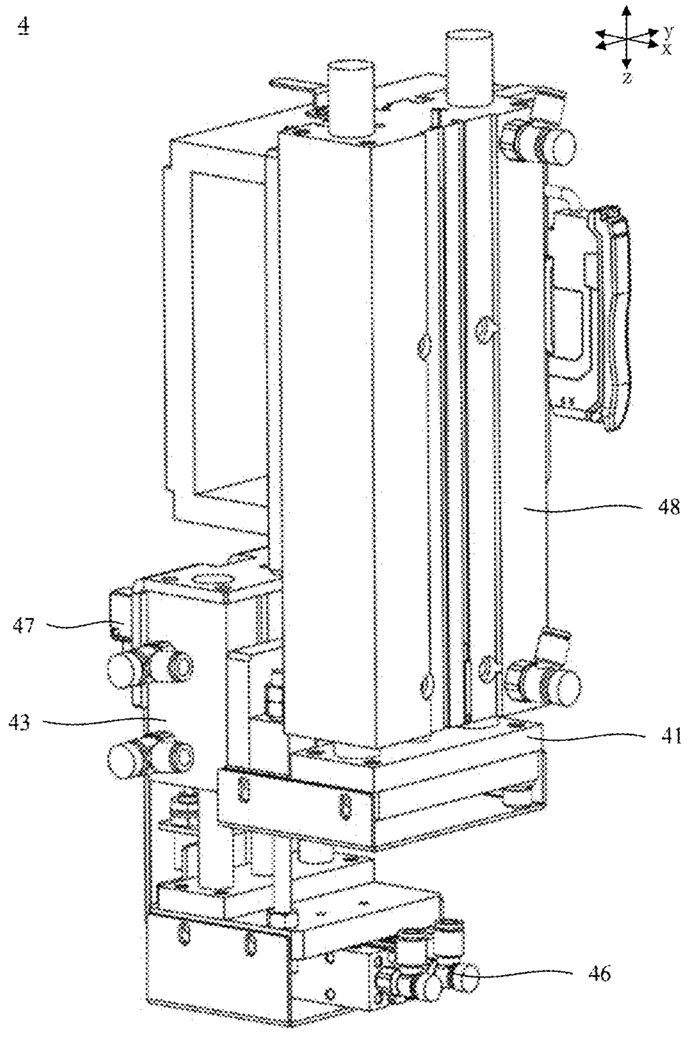
FIG. 14 is a first schematic structural diagram of a probe adjustment assembly in a test device according to an embodiment of the present disclosure.

Referring to FIGS. 4, 11 and 14, in some implementations of the present disclosure, the probe 23 is slidably connected to the corresponding probe card 22 along the second direction y. The test device 12 further includes a probe adjustment assembly 4, which includes a probe adjustment carrying member 41, a probe adjustment driving member 42 and a probe connecting mechanism 43, and the probe adjustment carrying member 41 is slidably connected to the crossbeam 31 along the second direction y. The probe adjustment driving member 42 is connected to the crossbeam 31, and the probe adjustment driving member 42 is connected in transmission with the probe adjustment carrying member 41 to drive the probe adjustment carrying member 41 to move relative to the crossbeam 31 along the second direction y. The probe connecting mechanism 43 is connected to the probe adjustment carrying member 41, and the probe connecting mechanism 43 is detachably connected with any of the probes 23.

In an embodiment of the present disclosure, the probe adjustment assembly 4 is connected to the power assembly 3. The power assembly 3 can drive the probe adjustment assembly 4 to move to the position of the probe card 22 to be adjusted, so that the probe adjustment assembly 4 can adjust the position of the probe 23 on the probe card 22.

Referring to FIGS. 1, 14, 15 and 17, the probe 23 includes a probe body 231 and a probe connecting portion 232. The probe body 231 is configured to contact the electrode post of the battery cell 92. The probe connecting portion 232 is configured to be connected with the probe connecting mechanism 43.

In an embodiment of the present disclosure, the probe adjustment carrying member 41 is configured to carry the probe connecting mechanism 43 and the like. The probe adjustment carrying member 41 may be a block-shaped structure, a rod-shaped structure, a plate-shaped structure, or the like. By way of example, the probe adjustment carrying member 41 has a rectangular block-shaped structure.

In an embodiment of the present disclosure, the probe adjustment driving member 42 can generate power to drive the probe adjustment carrying member 41 to move relative to the crossbeam 31, and then drive the probe connecting mechanism 43 on the probe adjustment carrying member 41 to move relative to the crossbeam 31, so as to be moved to the target position. The probe adjustment driving member 42 may be a telescopic cylinder, such as a pneumatic cylinder, a hydraulic cylinder, and the like. The probe adjustment driving member 42 may also be a motor, such as a servo motor, a stepper motor, and the like.

By way of example, the probe adjustment driving member 42 is a motor. The probe adjustment driving member 42 is fixedly connected to the crossbeam 31. The output shaft of the probe adjustment driving member 42 is connected in transmission to the probe adjustment carrying member 41. In some embodiments, the transmission between the output shaft of the probe adjustment driving member 42 and the probe adjustment carrying member 41 is conducted through rack and gear, screw and nut, worm and gear, and the like, which is not limited in the embodiments of the present disclosure.

Here, the probe adjustment carrying member 41 is slidably connected to the crossbeam 31, and the driving member for the probe 23 can drive the probe adjustment carrying member 41 to move relative to the crossbeam 31 along the second direction y, so that on the one hand, the probe adjustment carrying member 41 can move to the position of the probe 23 to be adjusted, and on the other hand, the probe connecting mechanism 43 on the probe adjustment carrying member 41 can move the probe 23 to be adjusted to the target position, thereby facilitating the adjustment of the spacing between the probes 23 on the same probe card 22 to adapt to different battery modules 9.

Figure 16:
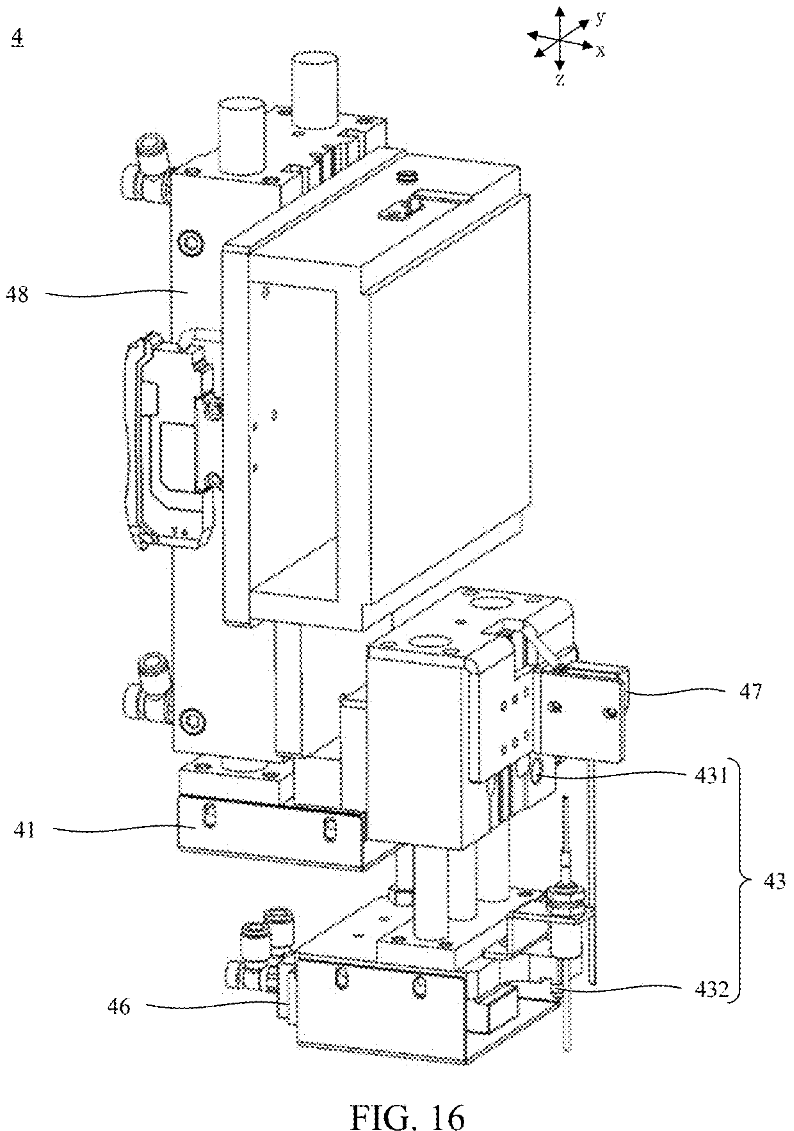
FIG. 16 is a second schematic structural diagram of a probe adjustment assembly in a test device according to an embodiment of the present disclosure.

Referring to FIGS. 12, 13 and 16, in some implementations of the present disclosure, the probe connecting mechanism 43 includes a probe connection driving member 431 and a probe connecting member 432. The probe connection driving member 431 is connected to the probe adjustment carrying member 41, and the probe connecting member 432 is connected to the output of the probe connection driving member 431. The probe connection driving member 431 is configured to drive the probe connecting member 432 to move close to or away from any probe 23, and the probe connecting member 432 is detachably connected with any of the probe cards.

In an embodiment of the present disclosure, the probe connecting member 432 is configured to be connected with or separated from the probe 23, and the probe connecting member 432 and the probe 23 can be connected by clamping, abutting and the like, so as to bring along the probe 23 connected therewith to move relative to the probe card 22. By way of example, the probe connecting member 432 is a column-shaped member and the probe connecting portion 232 is a connection hole. The probe connecting member 432 extends into the probe connecting portion 232 to clamp the probe connecting member 432 with the probe connecting portion 232 of the probe 23.

In an embodiment of the present disclosure, the probe connection driving member 431 is configured to drive the probe connecting member 432. The probe connection driving member 431 can drive the probe connecting member 432 to move close to a certain probe 23 so as to be connected with the probe 23, or drive the probe connecting member 432 to move away from the probe 23 connected therewith to be separated from the probe 23.

Figure 15:
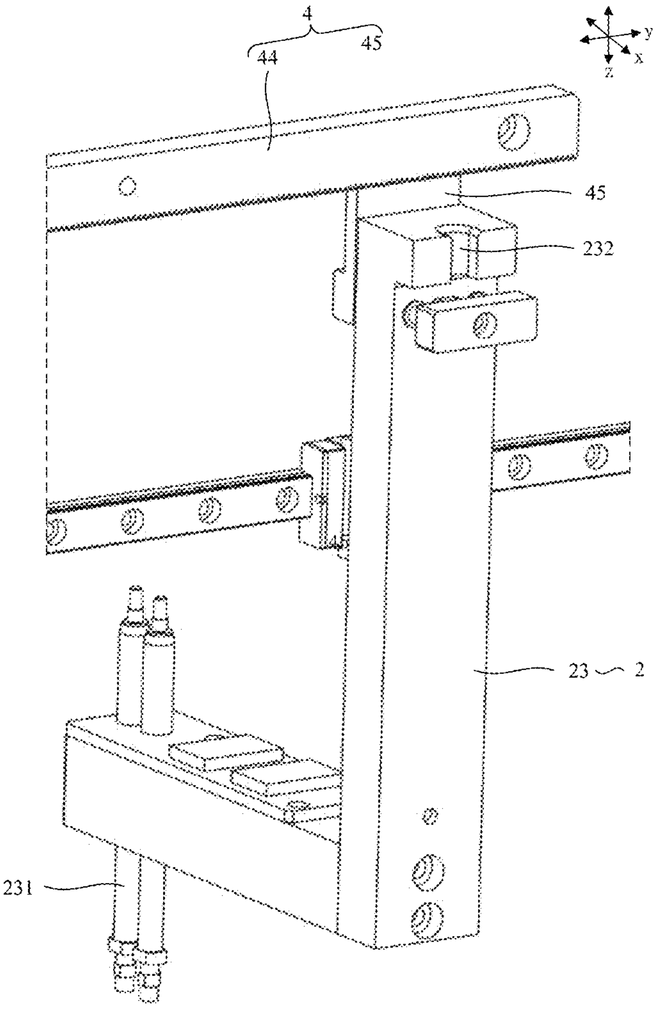
FIG. 15 is a schematic structural diagram of a first probe locking member and a second probe locking member in a test device according to an embodiment of the present disclosure.

In an embodiment of the present disclosure, the probe connection driving member 431 can drive the probe connecting member 432 to move along the first direction x, the second direction y, or the third direction z. For example, the probe connection driving member 431 can drive the probe connecting member 432 to move close to or away from the probe 23 along the first direction x, or the probe connection driving member 431 can drive the probe connecting member 432 to move close to or away from the probe 23 along the second direction y. Referring to FIGS. 15 and 16, in a possible embodiment of the present disclosure, the probe connection driving member 431 can drive the probe connecting member 432 to move close to or away from the probe 23 along the third direction z.

In an embodiment of the present disclosure, the connection manner between the probe connecting member 432 and the probe 23 is similar to that between the probe card connecting member 332 and the probe card 22. By way of example, the probe connecting member 432 is provided with a protrusion at the end away from the probe connection driving member 431, and the probe 23 is provided with a recess. Alternatively, the probe connecting member 432 is provided with a recess at the end away from the probe connection driving member 431, and the probe 23 is provided with a protrusion. The protrusion can extend into the recess, so that the probe connecting member 432 abuts against the probe 23 connected therewith along the second direction y.

In an embodiment of the present disclosure, the probe connecting member 432 may be a telescopic cylinder, such as a pneumatic cylinder, a hydraulic cylinder, and the like. The probe connecting member 432 may also be a motor, such as a servo motor, a stepper motor, and the like. By way of example, the probe connecting member 432 is a cylinder. The probe connecting member 432 is fixedly connected to the probe adjustment carrying member 41, and the output shaft of the probe connecting member 432 is fixedly connected to the probe connecting member 432.

Here, the probe connection driving member 431 can drive the probe connecting member 432 to move close to the probe 23 to connect the probe connecting member 432 with the probe 23, so that the probe adjustment driving member 42 can drive the probe 23 to move relative to the frame 0. The probe connection driving member 431 can also drive the probe connecting member 432 to move away from the probe 23 to separate the probe connecting member 432 from the probe 23, so that the probe adjustment driving member 42 can drive the probe adjustment carrying member 41 to move independently, so as to find the position of the probe 23 to be adjusted. Driving is provided by the driving member, which provides reliable power and is easy to realize.

In order to enable the probe 23 to be relatively fixed to the corresponding probe card 22 after the adjustment is completed, with reference to FIGS. 14 and 15, in some implementations of the present disclosure, the probe adjustment assembly 4 further includes a first probe locking member 44 and a second probe locking member 45. The first probe locking member 44 is fixedly connected to the probe card 22 and a second probe locking member 45 is connected to each probe 23, where the probe locking member 45 is slidably connected with the corresponding probe 23 to abut against the first probe locking member 44.

In an embodiment of the present disclosure, the first probe locking member 44 and the second probe locking member 45 can abut against each other by adsorption, such as magnetic attraction, negative pressure adsorption, and the like, or they can abut against each other by clamping or a similar manner, such as by a clamper.

In some embodiments, the second probe locking member 45 can abut against the first probe locking member 44 along the second direction y to lock the probe 23 connected with the second probe locking member 45 relative to the probe card 22. By way of example, the first probe locking member 44 and the second probe locking member 45 are both racks, and the second probe locking member 45 is slidably connected to the corresponding probe 23 along the third direction z. When the second probe locking member 45 is engaged with the first probe locking member 44, the corresponding probe 23 is locked relative to the probe card 22.

Here, the second probe locking member 45 can abut against the first probe locking member 44, so that the first probe locking member 44 limits the movement of the second probe locking member 45 along the second direction y, thereby limiting the movement of the probe 23 connected to the first probe locking member 44 relative to the probe card 22 along the second direction y. The second probe locking member 45 can also be separated from the first probe locking member 44. At this time, the probes 23 on the second probe locking member 45 can move along the second direction y to adjust the spacing between the multiple probes 23 on the probe card 22.

Figure 17:
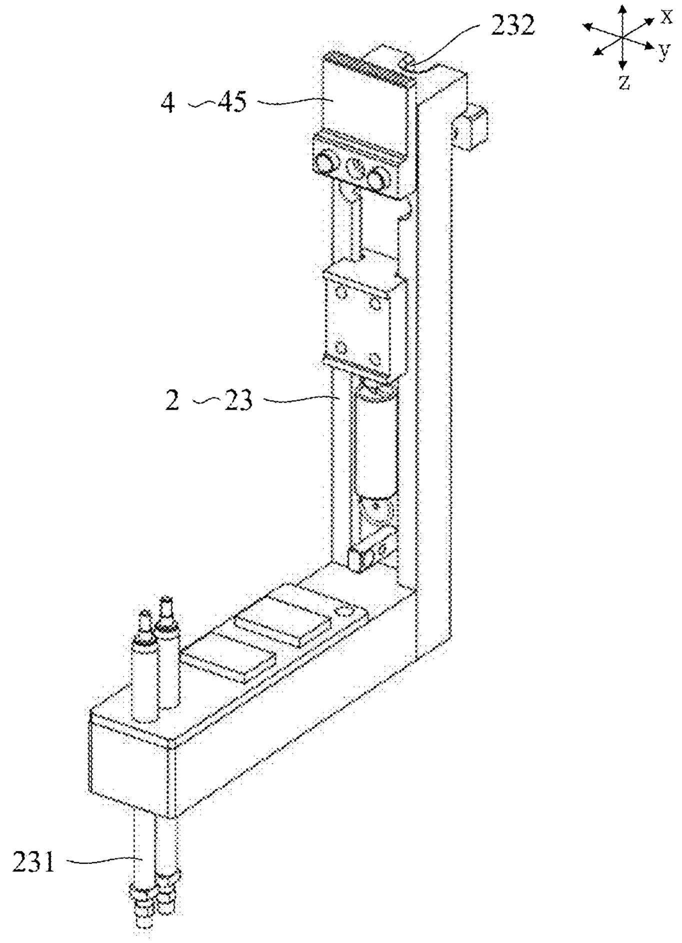
FIG. 17 is a schematic structural diagram of a probe in a test device according to an embodiment of the present disclosure.

Referring to FIGS. 13, 16 and 17, in some implementations of the present disclosure, the probe adjustment assembly 4 further includes an unlocking driving member 46 connected to the probe adjustment carrying member 41. The unlocking driving member 46 can drive any of the second probe locking members 45 to separate the corresponding second probe locking member 45 from the first probe locking member 44.

In an embodiment of the present disclosure, the unlocking driving member 46 may be a telescopic cylinder, such as a pneumatic cylinder, a hydraulic cylinder, and the like. The unlocking driving member 46 may also be a motor, such as a servo motor, a stepper motor, and the like. By way of example, the unlocking driving member 46 is a cylinder. The unlocking driving member 46 is fixedly connected to the probe adjustment carrying member 41 and can follow the probe adjustment carrying member 41 to move to the position of the probe 23 to be adjusted. The output shaft of the unlocking driving member 46 is extended or retracted along the third direction z. When the output shaft of the unlocking driving member 46 is extended, the second probe locking member 45 on the probe 23 to be adjusted is pushed away from the first probe locking member 44, so as to unlock the probe 23 to be adjusted from the corresponding probe card 22.

In an embodiment of the present disclosure, a locking structure can be provided so that the second probe locking member 45 can be maintained the locked state, or the second probe locking member 45 can be maintained in the locked state through gravity, or an elastic member such as a spring is provided between the second probe locking member 45 and the probe 23 connected therewith. When the unlocking driving member 46 drives the second probe locking member 45 away from the probe card 22 to be unlocked, elastic deformation occurs in the elastic member. When the output shaft of the unlocking driving member 46 is retracted, the second probe locking member 45 is driven to return to the locked state under the elastic force of the elastic member.

Here, the unlocking driving member 46 is connected to the probe adjustment carrying member 41, and can follow the probe adjustment carrying member 41 to move relative to the crossbeam 31 so as to move to the position of the probe 23 to be adjusted. Through engagement with the second probe locking member 45 on the probe 23 to be adjusted, the second probe locking member 45 can be driven to be separated from the corresponding first probe locking member 44, so as to unlock the probe 23 to be adjusted relative to the probe card 22. As such, unlocking of multiple probes 23 to be adjusted can be realized by merely one unlocking driving member 46, which has a simple structure and convenient operation.

Referring to FIGS. 15 and 16, in some implementations of the present disclosure, the probe adjustment assembly 4 further includes a probe positioning sensor 47 connected to the probe adjustment carrying member 41. The probe 23 is provided with a marker section, and the probe positioning sensor 47 is configured to detect the marker section.

In an embodiment of the present disclosure, the probe positioning sensor 47 may be a capacitive sensor, an inductive sensor, an electromagnetic sensor, a photoelectric sensor, an ultrasonic sensor and the like. By way of example, the probe positioning sensor 47 is a photoelectric sensor.

In an embodiment of the present disclosure, the marker section may be a protrusion, a depression, or the like on the probe 23, or it may be an identification code such as a two-dimensional code, a dot matrix code, or the like provided on the probe 23. In some embodiments, the marker section is a recess provided on the probe 23. The probe positioning sensor 47 can detect the distance, and by detecting its distance from the obstacle/probe 23, it can determine whether a probe 23 is present at the corresponding position.

Here, the probe positioning sensor 47 is provided. The probe positioning sensor 47 follows the probe adjustment carrying member 41 in movement, and the probe positioning sensor 47 can identify the marker section on the probe 23, thereby determining whether a probe 23 is present at the target position on the probe card 22, and assisting in positioning of the probe connecting member 432 relative to the probe 23, so as to adjust the position of the probe 23.

Referring to FIGS. 11, 14 and 16, in some implementations of the present disclosure, the probe adjustment assembly 4 further includes a probe positioning driving member 48. The probe positioning driving member 48 is slidably connected to the crossbeam 31 along the second direction y. The probe adjustment carrying member 41 is connected to the output of the probe positioning driving member 48, so that the probe adjustment carrying member 41 is slidably connected to the corresponding crossbeam 31. The probe positioning driving member 48 is configured to drive the probe adjustment carrying member 41 to move close to or away from the probe 23.

In an embodiment of the present disclosure, the probe positioning driving member 48 can drive the carrying member of the probe 23 to move along the third direction z, so that the carrying member of the probe 23 moves close to or away from the probe 23 along the third direction z, thereby allowing the probe connecting mechanism 43 on the probe adjustment carrying member 41, the unlocking driving member 46, and the like to move close to or away from the probe 23 to facilitate operation.

Here, the probe positioning driving member 48 can drive the probe adjustment carrying member 41 to move close to or away from the probe 23, so that the probe positioning sensor 47 can be moved close to or away from the probe 23. When the probe positioning sensor 47 is close to the probe 23, the interference can be reduced and the detection accuracy of the sensor can be improved. When the probe positioning driving member 48 drives the probe adjustment carrying member 41 to move away from the probe 23, more space can be reserved for the position of the probe 23, which is convenient for testing of the battery module 9.

In an embodiment of the present disclosure, the probe adjustment assembly 4 is provided on the crossbeam 31 of the power assembly 3. Therefore, when there are multiple power assemblies 3, each power assembly 3 is provided with a probe adjustment assembly 4, thereby improving accuracy of adjustment to the probe 23.

In an embodiment of the present disclosure, first the probe cards 22 can be moved by the power assembly 3, and then after all the probe cards 22 are moved into place, the probes 23 on each probe card 22 can be adjusted one by one; or after a probe card 22 is moved into place by the power assembly 3, the probes 23 on this probe card 22 are adjusted through the probe adjustment assembly 4 on the corresponding power assembly 3; or first the probes 23 on each probe card 22 are adjusted into place through the probe adjustment assembly 4, and then the position of the probe card 22 is adjusted through the power assembly 3. This is not limited in the embodiments of the present disclosure.

It can be understood that when the probe adjustment assembly 4 adjusts the probe 23, the power assembly 3 connected therewith will be connected to the corresponding probe card 22 through the probe card connecting member 332, so that during the adjustment by the probe adjustment assembly 4, the probe card 22 and the probe adjustment assembly 4 can maintain a position relative to each other along the first direction x.

On this basis, when the test device 12 needs to adjust the position of the probe 23 along the second direction y to adapt to different regimes where the battery cells in the different battery modules 9 have different thicknesses and sizes, with reference to FIGS. 4, 5, 13, 14 and 15, adjustment to the probe 23 on the first probe card **22*a* by the probe adjustment assembly 4 on the first power assembly 3*a* is taken as an example, and the probes 23 on other probe cards 22** are adjusted in a similar manner.

The control device 11 controls the probe adjustment driving member 42 so that the probe adjustment driving member 42 drives the probe positioning driving member 48 and the probe adjustment carrying member 41 thereon to move relative to the probe card 22 along the second direction y, and the position of the probe 23 relative to the probe card 22 is acquired by the probe positioning sensor 47 so that the probe positioning driving member 48 moves to the position of the probe 23 to be adjusted.

The control device 11 controls the probe positioning driving member 48 so that it drives the probe adjustment carrying member 41 to move close to the probe 23 to be adjusted, and then controls the probe connection driving member 431 so that the probe connection driving member 431 drives the probe connecting member 432 to be connected to the probe 23 to be adjusted, and controls the unlocking driving member 46 so that the unlocking driving member 46 drives the second probe locking member 45 on the probe 23 to be adjusted to move away from the first probe locking member 44 on the probe card 22, thereby unlocking the probe 23 to be adjusted from the probe card 22.

The control device 11 controls the probe adjustment driving member 42 so that the probe adjustment driving member 42 drives the probe connecting member 432 to move along the second direction y, thereby causing the probe 23 to be adjusted connected to the probe connecting member 432 to move along the second direction y to the target position. Then, the control device 11 controls the unlocking driving member 46 to be separated from the probe 23 to be adjusted. The second probe locking member 45 on the probe 23 to be adjusted is driven by the elastic member to abut against and become locked to the first probe locking member 44. The control device 11 also controls the probe connection driving member 431 to drive the probe connecting member 432 to be separated from the probe 23 to be adjusted, and controls the probe positioning driving member 48 to drive the probe adjustment carrying member 41 to move away from the probe 23 to be adjusted, thus completing the adjustment of the probe 23.

Referring to FIGS. 1 and 4, in some implementations of the present disclosure, a module bracket 5 is further included. The module bracket 5 is configured for placing the battery module 9. The module bracket 5 can move relative to the frame 0 along the third direction z to cause the battery module 9 to move close to or away from the probe 23. The third direction z is arranged at an included angle with respect to the first direction x and the second direction y respectively.

In an embodiment of the present disclosure, the module bracket 5 is configured to carry the battery module 9 and limit the position of the battery module 9. The module bracket 5 may have a plate-shaped structure, a block-shaped structure, or the like. A positioning pin may further be provided on the module bracket 5 to facilitate positioning of the battery module 9 relative to the module bracket 5.

Here, the module bracket 5 provided can support the battery module 9 and limit the position of the battery module 9. The module bracket 5 can move along the third direction z relative to the frame 0, and consequently bring along the battery module 9 to move close to or away from the probe 23, so that in replacement of the battery module 9, it can be moved away from the probe 23 to protect the probe 23, which facilitates testing. Also, the adjustment capability can be improved, facilitating testing of battery modules 9 of different sizes.

With continued reference to FIG. 4, in some implementations of the present disclosure, a lifting driving member 6 is further included. The lifting driving member 6 is connected to the frame 0. The output shaft of the lifting driving member 6 is connected to the module bracket 5 to drive the module bracket 5 to move along the third direction z.

In an embodiment of the present disclosure, the lifting driving member 6 is configured to drive the battery module 9 to move close to or away from the probe card 22, so that the probe 23 is connected to the corresponding electrode terminal post of the battery cell 92 in the battery module 9. In addition, the lifting driving member 6 drives the module bracket 5 to move along the third direction z so as to adapt to battery modules 9 of different sizes, further improving the versatility of the test device 12.

In an embodiment of the present disclosure, the lifting driving member 6 may be a telescopic cylinder, such as a pneumatic cylinder, a hydraulic cylinder, and the like. The lifting driving member 6 may also be a motor, such as a servo motor, a stepper motor, and the like. By way of example, the lifting driving member 6 is a cylinder.

The lifting driving member 6 is fixedly connected to the frame 0, and the output shaft of the lifting driving member 6 is connected in transmission to the module bracket 5. In some embodiments, the transmission between the output shaft of the lifting driving member 6 and the module bracket 5 is conducted through rack and gear, screw and nut, worm and gear, and the like, which is not limited in the embodiments of the present disclosure.

Here, the module bracket 5 is driven in movement by the lifting driving member 6, which has a reliable structure and is easy to realize.

With continued reference to FIG. 4, in some implementations of the present disclosure, a classification sensor 7 is further included. The classification sensor 7 is configured to detect the type of the battery module 9.

In an embodiment of the present disclosure, the classification sensor 7 may be a camera, a code scanner, a position sensor, and the like. By way of example, the classification sensor 7 is a camera that can capture an image of the module bracket 5. The control device 11 determines whether there is a battery module 9 on the module bracket 5 and the type of the battery module 9 based on the image.

As another example, the classification sensor 7 is a code scanner, and each battery module 9 is provided with a QR code, dot matrix code, or the like for identification. The control device 11 determines the type of the battery model 9 based on the information contained in the QR code or dot matrix code.

Alternatively, the classification sensor 7 is a position sensor, and multiple position sensors are provided. The multiple position sensors detect different positions of the module bracket 5 respectively. For example, when the multiple position sensors detect that there is a battery module 9 carried at the middle of the module bracket 5 and none at the two sides, the control device 11 determines that the battery module 9 is a single-row battery module 9. When the multiple position sensors detect that there are battery modules 9 at the middle as well as both sides of the module bracket 5, the control device 11 determines that the battery module 9 is a double-row battery module 9. The classification sensor 7 may be a capacitive sensor, an inductive sensor, an electromagnetic sensor, a photoelectric sensor, an ultrasonic sensor, or the like.

Here, the classification sensor 7 can detect the type of the battery module 9, so that the probe card 22 and the probe 23 can be adaptively adjusted based on the type of the battery module 9, which is more intelligent.

Figure 18:
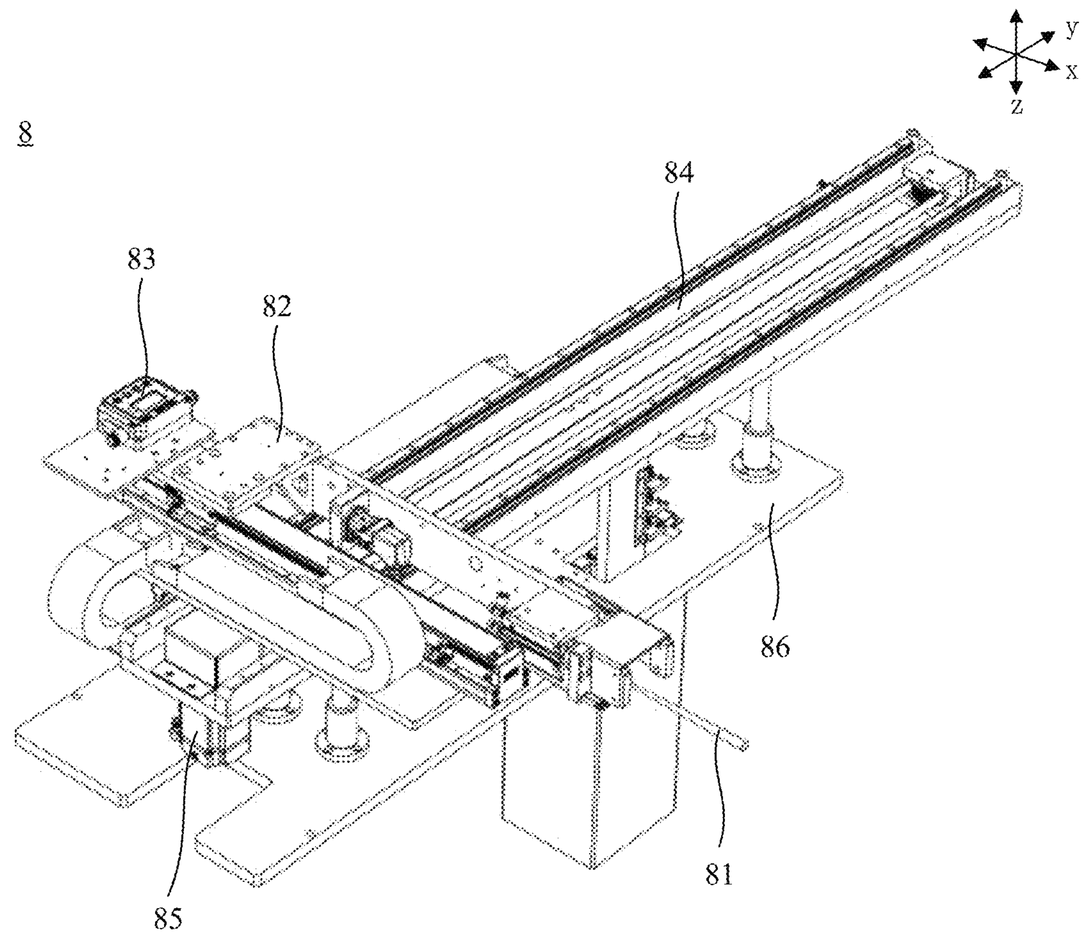
FIG. 18 is a first schematic structural diagram of a temperature measurement assembly in a test device according to an embodiment of the present disclosure.
Figure 19:
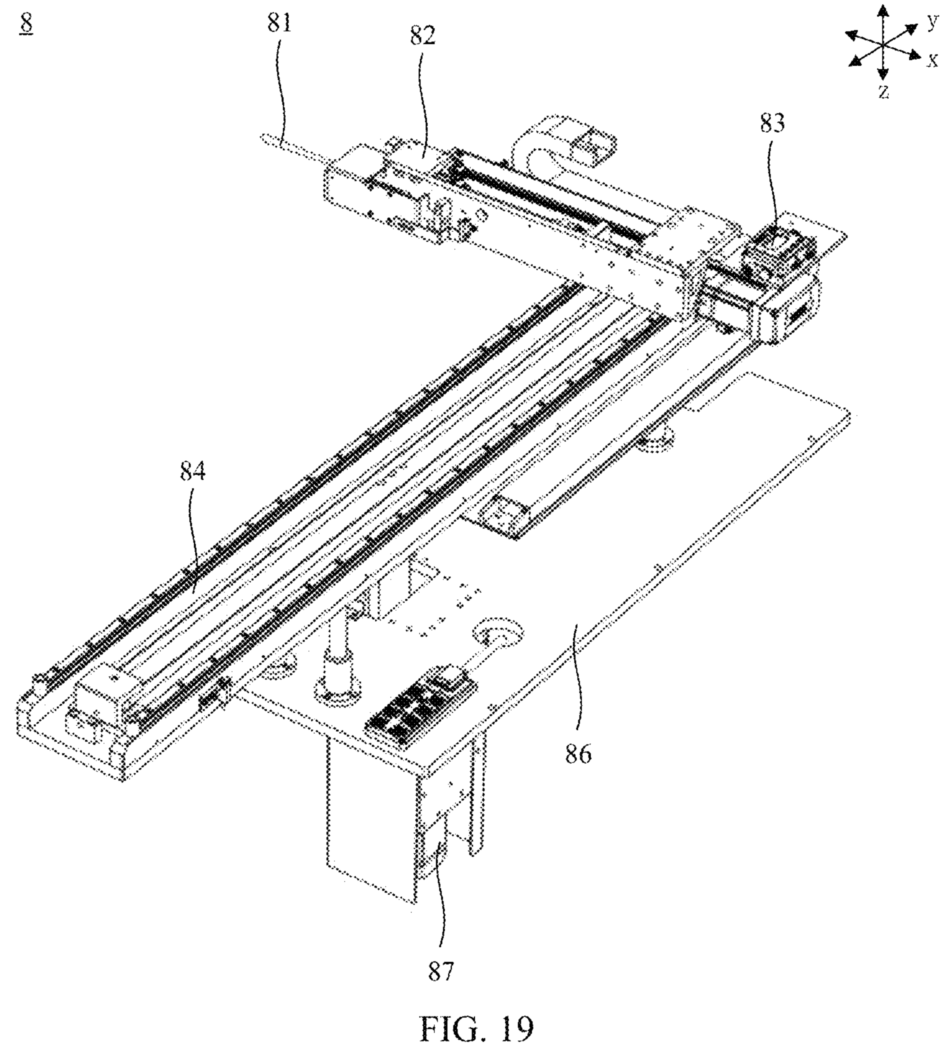
FIG. 19 is a second schematic structural diagram of a temperature measurement assembly in a test device according to an embodiment of the present disclosure.

Referring to FIGS. 4, 18 and 19, in some implementations of the present disclosure, a temperature measurement assembly 8 is further included, and the temperature measurement assembly 8 includes a temperature measurement sensor 81 connected to the frame 0. The temperature measurement sensor 81 is configured to detect the temperature of the battery module 9.

In an embodiment of the present disclosure, the temperature measurement sensor 81 may be a capacitive sensor, an inductive sensor, an electromagnetic sensor, a photoelectric sensor, an ultrasonic sensor, or the like. The temperature measurement sensor 81 may be a contact sensor or a non-contact sensor to acquire more accurate temperature of the battery module 9. By way of example, the temperature measurement sensor 81 is a contact sensor.

Here, by providing the temperature measurement sensor 81, the temperature of the battery module 9 during the test can be monitored, so as to provide an early warning when the temperature of the battery module 9 is abnormal.

In order to facilitate adjustment of position of the temperature measurement sensor 81 based on the size of the battery module 9 on the module bracket 5 to contact the battery module 9, with reference to FIGS. 18 and 19, in some implementations of the present disclosure, the temperature measurement assembly 8 includes a first temperature measurement carrying member 82 and a first temperature measurement driving member 83. The temperature measurement sensor 81 is connected to the first temperature measurement carrying member 82, and the first temperature measurement driving member 83 is connected to the frame 0. The first temperature measurement driving member 83 is configured to drive the first temperature measurement carrying member 82 to move along the first direction x.

In an embodiment of the present disclosure, the first temperature measurement carrying member 82 may have a block-shaped structure, a plate-shaped structure, a rod-shaped structure, or the like. For example, the first temperature measurement carrying member 82 has a long plate-shaped structure, and the first temperature measurement driving member 83 is fixed at one end of the first temperature measurement carrying member 82.

In an embodiment of the present disclosure, the first temperature measurement driving member 83 is configured to drive the temperature measurement sensor 81 to move relative to the frame 0 along the first direction x, so as to move close to or away from the frame 0 along the first direction x, that is, along the width direction of the battery module 9 for adjustment. The first temperature measurement driving member 83 may be a telescopic cylinder, such as a pneumatic cylinder, a hydraulic cylinder, and the like. The first temperature measurement driving member 83 may also be a motor, such as a servo motor, a stepper motor, and the like. By way of example, the first temperature measurement driving member 83 is a motor.

Here, the first temperature measurement driving member 83 can drive the first temperature measurement carrying member 82 to move relative to the frame 0, and then drive the temperature measurement sensor 81 to move, so that the temperature measurement sensor 81 can move close to or away from the battery module 9 on the frame 0 along the first direction x to adapt to battery modules 9 of different sizes.

With continued reference to FIGS. 4, 18 and 19, in some implementations of the present disclosure, the temperature measurement assembly 8 further includes a second temperature measurement carrying member 84 and a second temperature measurement driving member 85. The first temperature measurement driving member 83 is connected to the second temperature measurement carrying member 84, the first temperature measurement carrying member 82 is slidably connected to the second temperature measurement carrying member 84 along the first direction x, and the second temperature measurement driving member 85 is connected to the frame 0. The second temperature measurement driving member 85 is configured to drive the second temperature measurement carrying member 84 to move along the second direction y.

In an embodiment of the present disclosure, the second temperature measurement carrying member 84 may have a block-shaped structure, a plate-shaped structure, a rod-shaped structure, or the like. For example, the second temperature measurement carrying member 84 has a long plate-shaped structure. The first temperature measurement driving member 83 is fixedly connected to one end of the second temperature measurement carrying member 84. When the second temperature measurement driving member 85 drives the second temperature measurement carrying member 84 to move, the first temperature measurement carrying member 82 on the second temperature measurement carrying member 84 is also brought along to move, and consequently the temperature measurement sensor 81 is brought along to move along the second direction y.

In an embodiment of the present disclosure, the second temperature measurement driving member 85 is configured to drive the temperature measurement sensor 81 to move relative to the frame 0 along the second direction y, so as to move close to or away from the frame 0 along the second direction y, that is, along the length direction of the battery module 9, for adjustment. The second temperature measurement driving member 85 may be a telescopic cylinder, such as an air cylinder, a hydraulic cylinder, or the like, or a motor, such as a servo motor, a stepper motor, or the like. By way of example, the second temperature measurement driving member 85 is a motor.

Here, the second temperature measurement driving member 85 can drive the second temperature measurement carrying member 84 to move relative to the frame 0 along the second direction y and consequently drive the temperature measurement sensor 81 to move close to or away from the battery module 9 on the frame 0 along the second direction y, so as to adapt to the difference in size of different battery modules 9 along the second direction y.

With continued reference to FIGS. 4, 18 and 19, in some implementations of the present disclosure, the temperature measurement assembly 8 further includes a third temperature measurement carrying member 86 and a third temperature measurement driving member 87. The second temperature measurement driving member 85 is connected to the third temperature measurement carrying member 86, the second temperature measurement carrying member 84 is slidably connected to the third temperature measurement carrying member 86 along the second direction y, and the third temperature measurement driving member 87 is connected to the frame 0. The third temperature measurement driving member 87 is configured to drive the third temperature measurement carrying member 86 to move along the third direction z.

In an embodiment of the present disclosure, the third temperature measurement carrying member 86 may have a block-shaped structure, a plate-shaped structure, a rod-shaped structure, and the like. By way of example, the third temperature measurement carrying member 86 has a plate-shaped structure. The second temperature measurement driving member 85 is fixedly connected to the third temperature measurement carrying member 86. When the third temperature measurement driving member 87 drives the third temperature measurement carrying member 86 to move along the third direction z, the second temperature measurement carrying member 84 on the third temperature measurement carrying member 86 is also brought along to move, and consequently the temperature measurement sensor 81 is brought along to move along the third direction z.

In an embodiment of the present disclosure, the third temperature measurement driving member 87 is configured to drive the temperature measurement sensor 81 to move relative to the frame 0 along the third direction z, so as to move close to or away from the frame 0 along the third direction z, that is, along the thickness direction of the battery module 9 for adjustment. The third temperature measurement driving member 87 may be a telescopic cylinder, such as an air cylinder, a hydraulic cylinder, or the like, or a motor, such as a servo motor, a stepper motor, or the like. By way of example, the third temperature measurement driving member 87 is a cylinder.

Here, the third temperature measurement driving member 87 can drive the third temperature measurement carrying member 86 to move relative to the frame 0 along the third direction z, and consequently drive the temperature measurement sensor 81 to move close to or away from the battery module 9 on the frame 0 along the third direction z, so as to adapt to the difference in size of different battery modules 9 along the third direction z.

In addition, an embodiment of the present disclosure further provides a battery production line, which includes a production device, a transfer device and a testing system 1. The production device is configured to produce the battery module 9 to be tested, and the transfer device is configured to take out the battery module 9 to be tested from the production device and place it in the testing system 1, or take out the battery module 9 that has been tested from the testing system 1 and transfer it to the target station.

In an embodiment of the present disclosure, the production device is configured to produce battery modules. For example, the production device may be an assembly device that assembles the battery cells 92 into the shell 91, or the production device may also be a welding device that connects multiple battery cells 92 in the shell 91. The production device has many possible forms depending on the process sequence.

In an embodiment of the present disclosure, the transfer device has many possible forms. For example, the transfer device is a conveyor belt, which has a simple structure and high transportation efficiency. As another example, the transfer device is a robotic arm that can perform more complex operations.

In an embodiment of the present disclosure, the target station has many possible forms. For example, the target station may be the assembly station of the battery module 9. Specifically, the cover plate in the shell 91 is not installed before the test. The battery module 9 that has been tested will be transferred by the transfer device to the target position for installation of the cover plate. As another example, the target station is a testing station for, for example, vibration test, high temperature test, and the like. As yet another example, the target station is a recycling station, and when the battery module 9 fails the test, the transfer device will transfer it to the recycling station.

Figure 20:
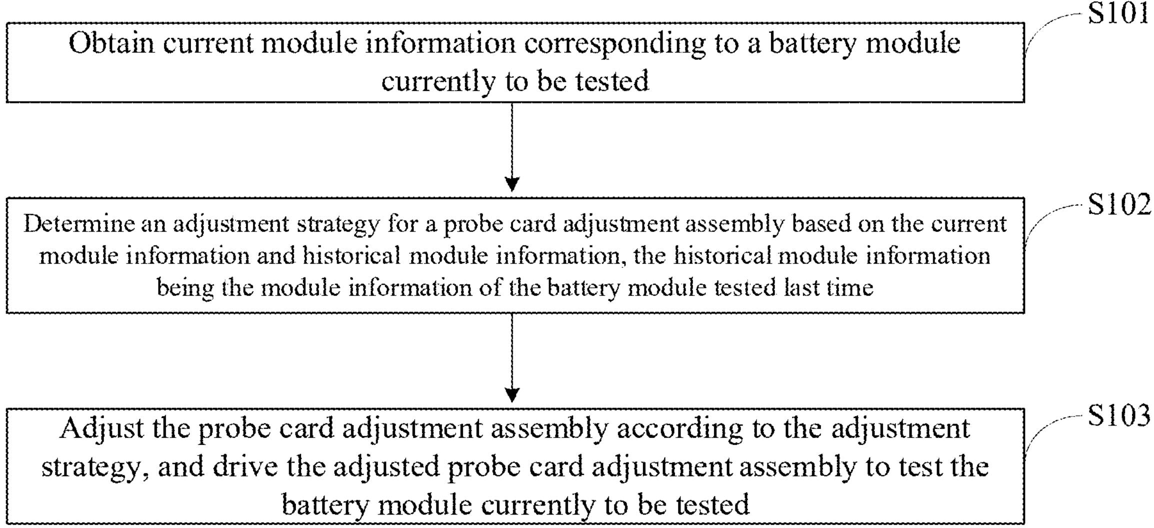
FIG. 20 is a schematic flowchart of a testing method according to an embodiment of the present disclosure.

Based on the above embodiment, in another embodiment of the present disclosure, a testing method applied to a control device in a testing system is provided. Referring to FIG. 3, the testing system 1 includes a control device 11 and a test device 12. The test device 12 includes at least two probe card adjustment assemblies 2. FIG. 20 is a schematic flow chart of a testing method according to an embodiment of the present disclosure. As shown in FIG. 20, the specific method is illustrated in steps S101 to S103.

In step S101, the current module information corresponding to the battery module currently to be tested is obtained.

In an embodiment of the present disclosure, the control device 11 obtains the current module information corresponding to the battery module 9 currently to be tested.

In an embodiment of the present disclosure, the control device 11 may be any one of a Programmable Logic Controller (PLC), a single-chip micro-computer, a central computer, and a host computer. The control device 11 can be selected according to the actual situation. This not limited here in the embodiments of the present disclosure.

In an embodiment of the present disclosure, the current module information can be obtained by scanning the electronic tag on the battery module currently to be tested through Radio Frequency Identification (RFID). The module information corresponding to the battery module currently to be tested is stored in the electronic tag.

In an embodiment of the present disclosure, referring to FIGS. 1 and 2, the current module information includes the structure or size of the battery cell 92 in the battery module 9 currently to be tested, such as the spacing between the positive electrode terminal post and the negative electrode terminal post of the battery cell 92, or the spacing between the same terminal posts of two adjacent battery cells 92; or the information of whether the battery module 9 currently to be tested is a single-row battery module or a double-row battery module. The current module information can be determined according to the actual situation. This is not limited in the embodiments of the present disclosure.

In step S102, the adjustment strategy for the probe card adjustment assembly is determined based on the current module information and historical module information. The historical module information is the module information of the battery module tested last time.

In an embodiment of the present disclosure, after obtaining the current module information corresponding to the battery module 9 currently to be tested, the control device 11 determines the adjustment strategy for the probe card adjustment assembly 2 based on the current module information and historical module information. The historical module information is the module information of the battery module 9 tested last time by the test device 12.

In an embodiment of the present disclosure, with continued reference to FIGS. 1 and 2, if it is determined based on the current module information and historical module information that the structure or size of the battery cell 92 in the battery module 9 to be tested this time is the same as that of the battery cell 92 in the battery module 9 at the time of the last test, that is, the two battery modules 9 are based on the same module, and are both a single-row or double-row battery module, then, since in testing of the battery module 9 by the test device, the battery cell 92 is tested by contacting the probes in the probe card adjustment assembly 2 with the positive and negative electrode terminal posts of the battery cell 92, and it is unnecessary to restore the probe card adjustment assembly 2 in the test device to the initial state at the end of each test, there is no need to adjust the probe card adjustment assembly 2 this time, and the probe card adjustment assembly 2 used last time can be directly used to test the battery module 9 currently to be tested.

In an embodiment of the present disclosure, if the two battery modules 9 are based on the same model, but the battery module 9 to be tested this time is a single row and the battery module 9 tested last time is a double row, or the battery module 9 to be tested this time is a double row and the battery module 9 tested last time is a single row, then, at this time, it is also necessary to determine the adjustment strategy, and then the probe card adjustment assembly 2 is adjusted according to the adjustment strategy.

In an embodiment of the present disclosure, if it is determined based on the current module information and historical module information that the structure or size of the battery cell 92 in the battery module 9 to be tested this time is different from that of the battery cell 92 in the battery module 9 tested last time, that is, the two battery modules 9 are based on different models, then, it is necessary to adjust the probe card adjustment assembly 2 this time, and then the battery module 9 currently to be tested is tested by using the adjusted probe card adjustment assembly 2.

In an embodiment of the present disclosure, referring to FIGS. 1 and 4, each probe card adjustment assembly 2 in the present disclosure includes at least two probe cards 22, and at least two probes 23 are connected to each probe card 22. A battery module 9 can be tested by a probe card adjustment assembly 2. By way of example, one probe card 22 in the probe card adjustment assembly 2 is contacted with the positive electrode terminal posts 921 of the same row of battery cells 92 in the battery module 9, and the other probe card 22 is contacted with the negative electrode terminal posts 922 of the same row of battery cells 92 in the battery module 9, so that a battery module 9 can be tested by a probe card adjustment assembly 2.

In an embodiment of the present disclosure, with reference to FIGS. 1, 4 and 7, the test device in the present disclosure includes at least two probe card adjustment assemblies 2. Therefore, a battery module 9 can also be tested by the probe cards 22 that are freely combined. By way of example, a battery module 9 is tested by a probe card 22 in one probe card adjustment assembly 2 combined with a probe card 22 in the other probe card adjustment assembly 2, that is, a probe card 22 in one probe card adjustment assembly 2 is contacted with the positive electrode terminal posts 921 of the same row of battery cells 92 in the battery module 9, and a probe card 22 in the other probe card adjustment assembly 2 is contacted with the negative electrode terminal posts 922 of the same row of battery cells 92 in the battery module 9, so that a battery module 9 can be tested by the two probe card adjustment assemblies 2 that are combined.

In an embodiment of the present disclosure, with reference to FIGS. 2 and 7, when the battery module 9 to be tested is a double-row one, the double-row battery module can also be tested at the same time by two probe card adjustment assemblies 2. By way of example, the battery cells 92 of the same row in the double-row battery module are tested by one probe card adjustment assembly 2, and the battery cells 92 of the other row in the double-row battery module are tested by the other probe card adjustment assembly 2, so that the double-row battery module can be tested at the same time by the two probe card adjustment assemblies 2.

In an embodiment of the present disclosure, with reference to FIGS. 1, 2, 4 and 7, since in testing of the battery module 9 by the probe card adjustment assembly 2, the spacing between two probe cards 22 in the probe card adjustment assembly 2 needs to be the same as the spacing between the positive and negative electrode terminal posts of the battery cell 92, and the spacing between two adjacent probes 23 in each probe card 22 needs to be the same as the spacing between the two adjacent same terminal posts in the battery cells 92, when the structure or size of the battery cell 92 in the battery module 9 currently to be tested is different from that of the battery cell 92 in the battery module 9 tested last time, it is necessary to adjust the probe card adjustment assembly 2.

In an embodiment of the present disclosure, since it is unnecessary to restore the probe card adjustment assembly 2 to the initial state at the end of test of the battery module 9, during the test of this time, the probe card adjustment assembly 2 is adjusted directly based on the state of the probe card adjustment assembly 2 at the end of the last test. It is necessary to determine the adjustment strategy for the probe card adjustment assembly 2 based on the current module information and historical module information, and then the probe card adjustment assembly 2 is adjusted according to the adjustment strategy.

In Step S103, the probe card adjustment assembly is adjusted according to the adjustment strategy, and the adjusted probe card adjustment assembly is driven to test the battery module currently to be tested.

In an embodiment of the present disclosure, after determining the adjustment strategy for the probe card adjustment assembly 2, the control device 11 adjusts the probe card adjustment assembly 2 according to the adjustment strategy, and drives the adjusted probe card adjustment assembly 2 to test the battery module 9 currently to be tested.

In an embodiment of the present disclosure, the probe card adjustment assembly 2 at this time is the probe card adjustment assembly 2 after the last test of the battery module 9, and the spacing between the probe cards 22 and the spacing between the probes 23 are the same as those for the battery module 9 tested last time.

In an embodiment of the present disclosure, the probe card adjustment assembly 2 includes at least two probe cards 22, and at least two probes 23 are connected to the probe cards 22. The control device 11 adjusts the probe card adjustment assembly 2 according to the adjustment strategy, including: adjusting the spacing between at least two probe cards 22 according to the adjustment strategy to obtain at least two preliminarily adjusted probe cards 22; adjusting the spacing between the probes 23 connected to the at least two preliminarily adjusted probe cards 22 according to the adjustment strategy to obtain at least two finally adjusted probe cards 22; and driving the at least two finally adjusted probe cards 22 to test the battery module 9 currently to be tested.

In an embodiment of the present disclosure, a probe card adjustment assembly 2 is used to test a single-row battery module. By way of example, with reference to FIGS. 1 and 4, if it is determined based on the current module information that the spacing between the positive and negative electrode terminal posts in the same battery cell 92 in this single-row battery module currently to be tested is M1, while the spacing between every two adjacent terminal posts (e.g., 921 in FIG. 1) is M2, and it is determined based on the historical module information that the spacing between the positive and negative electrode terminal posts in the same battery cell in the battery module tested last time is N1, while the spacing between every two adjacent terminal posts is N2, where M1 is greater than N1 and M2 is greater than N2, then at this time, it is necessary to increase the spacing between the two probe cards 22 in the probe card adjustment assembly 2 in correspondence with M1, and to increase the spacing between adjacent probes 23 connected to the probe cards 22 in correspondence with N1.

In an embodiment of the present disclosure, if two probe card adjustment assemblies 2 are used to test a double-row battery module, the two probe card adjustment assemblies 2 can be adjusted at the same time according to the adjustment strategy.

In an embodiment of the present disclosure, if a single-row battery module is tested using a combination of two probe card adjustment assemblies 2, the two probes 22 selected from the two probe card adjustment assemblies 2 for combination and the probes 23 thereon can be tested according to the adjustment strategy.

In an embodiment of the present disclosure, with reference to FIG. 4, the test device further includes a frame 0, and the probe card adjustment assembly further includes a probe card carrying member 21. The probe card carrying member 21 is slidably connected to the frame 0 along the first direction x; the control device adjusts the spacing between at least two probe cards 22 according to the adjustment strategy, including: according to the adjustment strategy, controlling the probe card carrying member 21 to slide in the first direction x by a first step; and controlling one of the at least two probe cards 22 to slide relative to the probe card carrying member 21 by a second step.

In an embodiment of the present disclosure, since one of the two probe cards 22 included in the probe card adjustment assembly 2 is fixed to the probe card carrying member 21, and the other probe card 22 is slidably connected to the probe card carrying member 21, the probe card carrying member 21 is controlled to slide in the first direction x by the first step, and at this time, the probe card 22 fixed to the probe card carrying member 21 also slides in the first direction x by the first step.

In an embodiment of the present disclosure, with continued reference to FIGS. 4 and 7, the test device further includes a power assembly 3. At least two probe cards 22 include a follower probe card and a sliding probe card. The follower probe card is fixedly connected to the probe card carrying member 21, and the sliding probe card is slidably connected to the probe card carrying member 21 along the first direction x. The control device 11 controls one of the at least two probe cards 22 to slide relative to the probe card carrying member 21 by a second step, including: according to the adjustment strategy, controlling the power assembly 3 to drive the sliding probe card to slide relative to the probe card carrying member 21 in the first direction x or the direction opposite to the first direction x by the second step, so that the spacing between the follower probe card and the sliding probe card is adjusted to the first distance.

In an embodiment of the present disclosure, with continued reference to FIG. 7, one probe card adjustment assembly 2 may include a second probe card 22*b* and a first probe card 22*a*, and the other probe card adjustment assembly 2 may include a third probe card 22*c* and a fourth probe card 22*d*. The probe card adjustment assembly 2 including the second probe card 22*b* and the first probe card 22*a* and the probe card adjustment assembly 2 including the third probe card 22*c* and the fourth probe card 22*d* are used to test a double-row battery module. By way of example, in the double-row battery module, with reference also to FIG. 2, it is necessary to first control the power assembly to drive the first probe card carrying member 21*a* to slide in the first direction x (e.g., to the left in FIG. 7) by a first step based on the distance between two adjacent terminal posts of battery cells (e.g., battery cells 92) in different rows and the same column. Since the second probe card 22*b* is fixedly connected to the first probe card carrying member 21*a*, when the first probe card carrying member 21*a* slides in the first direction x by the first step, the second probe card 22*b* is brought along to slide in the first direction x by the first step. Meanwhile, the power assembly 3 can be controlled to drive the second probe card carrying member 21*b* to slide in the first direction x (e.g., to the right in FIG. 7) by the first step. Since the third probe card 22*c* is fixedly connected to the second probe card carrying member 21*b*, when the second probe card carrying member 21*b* slides in the first direction x by the first step, the third probe card 22*c* is brought along to slide in the first direction x by the first step, so that the spacing between the second probe card 22*b* and the third probe card 22*c* is the same as the distance between two adjacent terminal posts of battery cells in different rows and the same column in the double-row battery module. Then the power assembly 3 is controlled to drive the first probe card 22*a* to slide in the first direction x (e.g., to the left in FIG. 7) by a second step, so that the distance between the first probe card 22*a* and the second probe card 22*b* is the same as the spacing between the positive and negative electrode terminal posts of the battery cells in the same row. Finally, similarly, the power assembly is controlled to drive the fourth probe card 22*d* to slide in the first direction x (e.g., to the right in FIG. 7) by a second step, so that the distance between the fourth probe card 22*d* and the third probe card 22*c* is the same as the spacing between the positive and negative electrode terminal posts of the battery cells in the same row. At this point, the probe card with the adjusted spacing is obtained.

In an embodiment of the present disclosure, with continued reference to FIGS. 4 and 7, the probe card adjustment assembly 2 further includes a first probe card locking member 24 and a second probe card locking member 25. After controlling the power assembly 3 to drive the sliding probe card to slide relative to the probe card carrying member 21 in the first direction x by a second step, the method further includes: controlling the first probe card locking member 24 to lock the probe card carrying member 21 relative to the frame 0; and controlling the second probe card locking member 25 to lock the sliding probe card relative to the probe card carrying member 21.

In an embodiment of the present disclosure, with continued reference to FIG. 7, a probe card adjustment assembly 2 may further include a first probe card locking member 24 and a second probe card locking member 25. The first probe card locking member 24 is connected to the frame 0, and is configured to lock or unlock the probe card carrying member 21 relative to the frame 0. The second probe card locking member 25 is connected to the probe card carrying member 21, and is configured to lock or unlock the sliding probe card relative to the probe card carrying member 21.

In an embodiment of the present disclosure, before adjustment of the spacing between the probe cards 22 in the probe card adjustment assembly 2, the first probe card locking member 24 and the second probe card locking member 25 can be set to an unlocked state. After adjustment of the spacing between the probe cards 22, the first probe card locking member 24 and the second probe card locking member 25 can be set to a locked state, so that testing can be performed based on the probe card with the adjusted spacing.

In an embodiment of the present disclosure, with continued reference to FIG. 11, the test device further includes a probe adjustment assembly 4. At least two probes 23 connected to the probe card 22 are arranged along the second direction y. The spacing between the probes 23 connected to at least two preliminarily adjusted probe cards 22 is adjusted according to the adjustment strategy, including: controlling the power assembly 3 to drive the probe adjustment assembly 4 to move to each of the at least preliminarily adjusted two probe cards 22; and according to the adjustment strategy, controlling the probe adjustment assembly 4 to drive each probe 23 on the probe card 22 to move in the second direction y by a third step, so that the spacing between every two adjacent probes 23 is adjusted to a second distance.

In an embodiment of the present disclosure, after the spacing between the probe cards 22 is adjusted, the spacing between the probes 23 needs to be adjusted. Since each row of probes 23 needs to be correspondingly contacted with the same corresponding terminal posts of the same row of battery cells in the battery module 9, the spacing between every two probes 23 needs to be the same as the spacing between every two same terminal posts of the same row of battery cells 92. By way of example, with continued reference to FIG. 11, the probe 23 is slidably connected to the corresponding probe card 22 along the second direction y, and the power assembly 3 can drive the probe adjustment assembly 4 to move to the position of the probe card 22 to be adjusted, so that the probe adjustment assembly 4 can adjust the position of the probe 23 on the probe card 22.

In an embodiment of the present disclosure, with reference to FIGS. 13 and 15, the probe adjustment assembly 4 includes a first probe locking member 44 and a second probe locking member 45. After the control device controls the probe adjustment assembly 4 to drive each probe 23 on the probe card 22 to move in the second direction y by the third step, the method further includes: controlling the first probe locking member 44 and the second probe locking member 45 of each probe 23 to lock each probe 23.

In an embodiment of the present disclosure, with reference to FIGS. 14 and 15, the probe adjustment assembly 4 further includes a first probe locking member 44 and a second probe locking member 45. The first probe locking member 44 is connected to the probe adjustment carrying member 41. A second probe locking member 45 is connected to each probe 23. The second probe locking member 45 is slidably connected with the corresponding probe 23 so as to be connected with or separated from the first probe locking member 44. After adjustment of the position of the probe 23, the second probe locking member 45 can be abutted against the first probe locking member 44 along the second direction y to lock the probe 23 connected to the second probe locking member 45 relative to the probe adjustment carrying member 41.

In an embodiment of the present disclosure, with reference to FIG. 4, the test device further includes a module bracket 5 for placing the battery module 9 currently to be tested. The method further includes: in response to the test start signal, controlling the module bracket 5 for placing the battery module 9 currently to be tested to move along the third direction z to move the battery module 9 close to the adjusted probe card adjustment assembly 2; and in response to the test end signal, controlling the module bracket 5 to move along the third direction z to move the battery module 9 away from the adjusted probe card adjustment assembly 2.

In an embodiment of the present disclosure, with continued reference to FIG. 4, the test device further includes a module bracket 5 for placing the battery module 9. The module bracket 5 can move relative to the frame 0 along the third direction z to cause the battery module 9 to move close to or away from the probe 23. The third direction z is different from both the first direction x and the second direction y.

In an embodiment of the present disclosure, before the test starts, the module bracket 5 is controlled to move upward along the third direction z to move the battery module 9 close to the adjusted probe card adjustment assembly 2, so that the terminal post of the battery cell 92 comes in contact with the probe 23 to start the test. After the test ends, the module bracket 5 is controlled to move downward along the third direction z to move the battery module 9 away from the adjusted probe card adjustment assembly 2, so that the terminal post of the battery cell 92 is separated from the probe 23.

In an embodiment of the present disclosure, with reference to FIG. 18, the test device further includes a temperature measurement sensor 81. The method further includes: detecting the temperature of the battery module currently to be tested by the temperature measurement sensor 81. When the temperature is greater than a preset temperature threshold, an alarm message is output.

In an embodiment of the present disclosure, with continued reference to FIGS. 4, 18 and 19, the test device further includes a temperature measurement assembly 8. The temperature measurement assembly 8 includes a temperature measurement sensor 81 that is connected to the frame 0 and configured to detect the temperature of the battery module 9.

In an embodiment of the present disclosure, by providing the temperature measurement sensor 81, the temperature of the battery module 9 during testing can be monitored, so as to provide an early warning when the temperature of the battery module 9 is abnormal.

Embodiments of the present disclosure provide a testing method. The method includes: obtaining current module information corresponding to the battery module currently to be tested; determining an adjustment strategy for the probe card adjustment assembly based on the current module information and historical module information, the historical module information being the module information of the battery module tested last time; and adjusting the probe card adjustment assembly according to the adjustment strategy, and driving the adjusted probe card adjustment assembly to test the battery module currently to be tested. With the implementation described above, the current adjustment strategy for the probe card adjustment assembly in the test device can be determined based on the module information of the battery module tested currently and the module information of the battery tested last time, so that the probe card adjustment assembly can adapt quickly to different types of battery modules.

In addition, in an embodiment of the present disclosure, the control device 11 may include a processor and a memory having processor-executable instructions stored therein. When the instructions are executed by the processor, the testing method described above is implemented.

The above embodiments are only used to illustrate the technical solutions of the present disclosure and not to limit them. While the present disclosure has been described in detail with reference to the preceding embodiments, those skilled in the art should appreciate that: it is still possible to modify the technical solutions recited in the preceding embodiments, or to equivalently substitute for some or all of the technical features; and these modifications or substitutions do not deviate the essence of the corresponding technical solutions from the scope of the technical solutions of the embodiments of the present disclosure, and should be covered by the scope of the specification of the present disclosure. In particular, the technical features mentioned in the various embodiments can be combined in any manner as long as there is no structural conflict. The present disclosure is not limited to the particular embodiments disclosed herein, and includes all technical solutions falling within the scope of the specification.

INDUSTRIAL APPLICABILITY

In the technical solution of the embodiments of the present disclosure, the frame is configured to carry the probe card adjustment assembly. The probe card adjustment assembly includes a probe card carrying member and at least two probe cards. The probe card carrying member can bring along the at least two probe cards thereon to slide along the first direction, so as to adjust the spacing between the probe cards on two adjacent probe card carrying members, that is, to adjust the distance between two adjacent follower probe cards. On this basis, one of the at least two probe cards on the same probe card carrying member can move relative to the probe card carrying member, so as to adjust the spacing between the at least two probe cards on the same probe card carrying member, that is, to adjust the distance between the follower probe card and the sliding probe card connected to the same probe card carrying member. Due to provision of the probe card carrying member, multiple probe cards can be brought along to move at the same time, thereby improving the adjustment efficiency, and during the switching of battery modules in different battery rows, instead of moving each probe card on the probe card carrying member, it is only necessary to move the probe card carrying member to achieve rapid switching to adapt to battery modules in different battery rows.

What is claimed is:

1. A testing system, comprising a control device and a test device, wherein:

the test device comprises a frame and at least two probe card adjustment assemblies;

the control device is connected to the test device, and is configured to adjust the probe card adjustment assemblies according to an adjustment strategy, and drive the adjusted probe card adjustment assemblies to test a battery module currently to be tested;

the adjustment strategy is determined based on current module information of the battery module currently to be tested and historical module information of a battery module tested last time;

wherein the probe card adjustment assemblies are arranged along a first direction, and each probe card adjustment assembly comprises:

a probe card carrying member slidably connected to the frame along the first direction;

at least two probes arranged along a second direction, wherein the probes are configured to test the battery module; and at least two probe cards, each connecting to a probe;

wherein the first direction is arranged at an included angle with respect to the second direction.

2. The testing system according to claim 1, wherein the at least two probe cards comprise a follower probe card and a sliding probe card, the follower probe card is fixedly connected to the probe card carrying member, and the sliding probe card is slidably connected to the probe card carrying member along the first direction.

3. The testing system according to claim 2, wherein the test device further comprises a power assembly, and the power assembly comprises:

a crossbeam slidably connected to the frame along the first direction;

a crossbeam driving member connected to the frame and connected in transmission to the crossbeam to drive the crossbeam to move relative to the frame along the first direction; and a probe card connecting mechanism connected to the crossbeam and detachably connected to any of the probe cards.

4. The testing system according to claim 3, wherein the probe card connecting mechanism comprises:

a probe card connection driving member connected to the crossbeam; and a probe card connecting member connected to an output of the probe card connection driving member, wherein the probe card connection driving member is configured to drive the probe card connecting member to move close to or away from any of the probe cards, and the probe card connecting member is detachably connected to any of the probe cards.

5. The testing system according to claim 4, wherein the probe card connecting member is provided with a protrusion at the end away from the probe card connection driving member, and the probe card is provided with a recess; or, the probe card connecting member is provided with a recess at the end away from the probe card connection driving member, and the probe card is provided with a protrusion;

wherein the protrusion is configured to be extendable into the recess, so that the probe card connecting member abuts against the probe card connected therewith along the first direction.

6. The testing system according to claim 2, wherein the probe card adjustment assembly further comprises:

a first probe card locking member connected to the frame and configured to lock or unlock the probe card carrying member relative to the frame; and a second probe card locking member connected to the probe card carrying member and configured to lock or unlock the sliding probe card relative to the probe card carrying member.

7. The testing system according to claim 2, wherein the probe card adjustment assembly further comprises a probe card positioning sensor connected to the probe card and configured to detect a position of the corresponding probe card relative to the frame.

8. The testing system according to claim 3, wherein the probe is slidably connected to the corresponding probe card along the second direction, the test device further comprises a probe adjustment assembly, and the probe adjustment assembly comprises:

a probe adjustment carrying member slidably connected to the crossbeam along the second direction;

a probe adjustment driving member connected to the crossbeam and connected in transmission to the probe adjustment carrying member to drive the probe adjustment carrying member to move relative to the crossbeam along the second direction; and a probe connecting mechanism connected to the probe adjustment carrying member, the probe connecting mechanism being detachably connected to any of the probes.

9. The testing system according to claim 8, wherein the probe connecting mechanism comprises:

a probe connection driving member connected to the probe adjustment carrying member; and a probe connecting member connected to an output of the probe connection driving member, wherein the probe connection driving member is configured to drive the probe connecting member to move close to or away from any of the probes, and the probe connecting member is detachably connected to any of the probe cards.

10. The testing system according to claim 8, wherein the probe adjustment assembly further comprises:

a first probe locking member connected to the probe adjustment carrying member; and a second probe locking member connected to each of the probes, wherein the second probe locking member is configured to abut against the first probe locking member along the second direction to lock the probe connected to the second probe locking member relative to the probe adjustment carrying member;

wherein the second probe locking member is slidably connected to the corresponding probe to abut against the first probe locking member.

11. The testing system according to claim 10, wherein the probe adjustment assembly further comprises an unlocking driving member connected to the probe adjustment carrying member and configured to drive any of the second probe locking members to separate the corresponding second probe locking member from the first probe locking member.

12. The testing system according to claim 10, wherein the probe adjustment assembly further comprises a probe positioning sensor connected to the probe adjustment carrying member, the probe is provided with a marker section, and the probe positioning sensor is configured to detect the marker section.

13. The testing system according to claim 10, wherein the probe adjustment assembly further comprises a probe positioning driving member slidably connected to the crossbeam along the second direction, the probe adjustment carrying member is connected to the output of the probe positioning driving member, and the probe positioning driving member is configured to drive the probe adjustment carrying member to move close to or away from the probe.

14. The testing system according to claim 2, wherein the test device further comprises a module bracket configured for placing the battery module, and the module bracket is configured to move relative to the frame along a third direction to move the battery module close to or away from the probe; and the third direction is arranged at an included angle with respect to the first direction and the second direction respectively.

15. The testing system according to claim 14, wherein the test device further comprises a lifting driving member connected to the frame, and an output shaft of the lifting driving member is connected to the module bracket to drive the module bracket to move along the third direction.

16. The testing system according to claim 1, wherein the test device further comprises a classification sensor configured to detect the type of the battery module.

17. The testing system according to claim 14, wherein the test device further comprises a temperature measurement assembly, and the temperature measurement assembly comprises a temperature measurement sensor connected to the frame and configured to detect the temperature of the battery module.

18. The testing system according to claim 17, wherein the temperature measurement assembly further comprises:

a first temperature measurement carrying member connected to the temperature measurement sensor; and a first temperature measurement driving member connected to the frame and configured to drive the first temperature measurement carrying member to move along the first direction.

19. The testing system according to claim 18, wherein the temperature measurement assembly further comprises:

a second temperature measurement carrying member connected to the first temperature measurement driving member, wherein the first temperature measurement carrying member is slidably connected to the second temperature measurement carrying member along the first direction; and a second temperature measurement driving member connected to the frame and configured to drive the second temperature measurement carrying member to move along the second direction.

20. The testing system according to claim 19, wherein the temperature measurement assembly further comprises:

a third temperature measurement carrying member connected to the second temperature measurement driving member, wherein the second temperature measurement carrying member is slidably connected to the third temperature measurement carrying member along the second direction; and a third temperature measurement driving member connected to the frame and configured to drive the third temperature measurement carrying member to move along the third direction;

wherein the third direction is arranged at an included angle with respect to the first direction and the second direction respectively.

* * * * *